US012610843B2

(12) United States Patent
Lo

(10) Patent No.: US 12,610,843 B2
(45) Date of Patent: Apr. 21, 2026

(54) SEMICONDUCTOR STRUCTURE HAVING DUMMY CONDUCTIVE MEMBER AND MANUFACTURING METHOD THEREOF

(71) Applicant: NANYA TECHNOLOGY CORPORATION, New Taipei City (TW)

(72) Inventor: Yi-Jen Lo, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 471 days.

(21) Appl. No.: 18/369,311

(22) Filed: Sep. 18, 2023

(65) Prior Publication Data

US 2024/0096829 A1     Mar. 21, 2024

Related U.S. Application Data

(62) Division of application No. 17/945,410, filed on Sep. 15, 2022.

(51) Int. Cl.
H10W 72/90         (2026.01)
H10W 99/00         (2026.01)
(Continued)

(52) U.S. Cl.
CPC ........... H10W 72/90 (2026.01); H10W 99/00 (2026.01); H10W 72/963 (2026.01);
(Continued)

(58) Field of Classification Search
CPC . H10W 72/90; H10W 72/967; H10W 72/963; H10W 99/00; H10W 80/327; H10W 90/792
See application file for complete search history.

(56) References Cited

U.S. PATENT DOCUMENTS 7,812,459 B2 * 10/2010 Yu ........................ H10D 84/038
                                                        257/E21.511
10,777,534 B2 * 9/2020 Huang .................. H10W 90/00
(Continued)

FOREIGN PATENT DOCUMENTS

| TW | 201916775 A | 4/2019 |
| TW | 202046481 A | 12/2020 |
| TW | 202135240 A | 9/2021 |

OTHER PUBLICATIONS

Office Action and Search Report mailed on Jan. 12, 2024 related to Taiwanese Application No. 112110692.

(Continued)

*Primary Examiner* — Nathan W Ha
(74) *Attorney, Agent, or Firm* — Xuan Zhang

(57)                     ABSTRACT

The present application provides a semiconductor structure having a dummy conductive member, and a manufacturing method of the semiconductor structure. The semiconductor structure includes a first wafer including a first substrate, a first dielectric layer over the first substrate, a first bonding layer over the first dielectric layer, a first via extending through the first bonding layer, and a first dummy conductive member disposed adjacent to the first via and extending partially through the first bonding layer; and a second wafer including a second bonding layer over the first bonding layer, a second via extending through the second bonding layer, a second dummy conductive member disposed adjacent to the second via and extending partially through the second bonding layer, a second dielectric layer over the second bonding layer, and a second substrate over the second dielectric layer.

14 Claims, 39 Drawing Sheets

100

(51) Int. Cl.
      *H10W 80/00*                (2026.01)
      *H10W 90/00*                (2026.01)

(52) U.S. Cl.
      CPC ........ *H10W 72/967* (2026.01); *H10W 80/312*
          (2026.01); *H10W 80/327* (2026.01); *H10W*
                                  *90/792* (2026.01)

(56)                    References Cited

U.S. PATENT DOCUMENTS

| | | | |
|---|---|---|---|
| 10,879,214 | B2 | 12/2020 | Chen et al. |
| 12,100,634 | B2 * | 9/2024 | Shih ........................ H10P 72/74 |
| 2008/0142990 | A1 | 6/2008 | Yu et al. |
| 2015/0021785 | A1 | 1/2015 | Lin |
| 2015/0279888 | A1 | 10/2015 | Chen et al. |
| 2018/0012868 | A1 | 1/2018 | Huang et al. |
| 2019/0131276 | A1 | 5/2019 | Chen et al. |
| 2020/0058617 | A1 | 2/2020 | Wu et al. |
| 2020/0303351 | A1 * | 9/2020 | Wu ........................ H10W 90/00 |
| 2020/0312817 | A1 * | 10/2020 | Wu ........................ H10W 90/00 |
| 2021/0091064 | A1 | 3/2021 | Chen et al. |
| 2021/0280544 | A1 | 9/2021 | Chen et al. |
| 2022/0130761 | A1 | 4/2022 | Kim et al. |
| 2022/0173092 | A1 | 6/2022 | Chen et al. |
| 2022/0262770 | A1 * | 8/2022 | Wu ........................ H10W 90/00 |
| 2022/0310554 | A1 | 9/2022 | Chen et al. |
| 2022/0359490 | A1 | 11/2022 | Chen et al. |
| 2023/0103629 | A1 * | 4/2023 | Chen ........................ H10P 72/74 |
| | | | 257/737 |
| 2024/0030082 | A1 | 1/2024 | Chang |
| 2024/0063151 | A1 | 2/2024 | Lo |
| 2024/0096829 | A1 | 3/2024 | Lo |
| 2024/0355784 | A1 * | 10/2024 | Wu ........................ H10W 90/00 |
| 2025/0183208 | A1 | 6/2025 | Lo |

OTHER PUBLICATIONS

Office Action and Search Report mailed on Jan. 24, 2024 related to
Taiwanese Application No. 112147221.
Office Action and and the search report mailed on Nov. 4, 2025
related to U.S. Appl. No. 17/945,410, wherein this application is a
DIV of U.S. Appl. No. 17/945,410.

* cited by examiner

SEMICONDUCTOR STRUCTURE HAVING DUMMY CONDUCTIVE MEMBER AND MANUFACTURING METHOD THEREOF

CROSS-REFERENCE TO RELATED APPLICATION

This application is a divisional application of U.S. Non-Provisional application Ser. No. 17/945,410 filed Sep. 15, 2022, which is incorporated herein by reference in its entirety.

TECHNICAL FIELD

The present disclosure relates to a semiconductor structure, and a method of manufacturing the semiconductor structure. Particularly, the present disclosure relates to a semiconductor structure having a dummy conductive member between two wafers for increasing a bonding strength between the two wafers, and a method of manufacturing the semiconductor structure including forming the dummy conductive member between the two wafers.

DISCUSSION OF THE BACKGROUND

Semiconductor devices are used in a variety of electronic applications, such as personal computers, cellular telephones, digital cameras, and other electronic equipment. Fabrication of semiconductor devices involves sequentially depositing various material layers over a semiconductor wafer, and patterning the material layers using lithography and etching processes to form microelectronic components, including transistors, diodes, resistors and/or capacitors, on or in the semiconductor wafer.

The semiconductor industry continues to improve integration density of the microelectronic components by continual reduction of minimum feature size, which allows more components to be integrated into a given area. Smaller package structures with smaller footprints are developed to package the semiconductor devices, in order to facilitate formation and integration of components of different sizes. However, such formation and integration may increase complexity of manufacturing processes. It is therefore desirable to develop improvements that address the aforementioned challenges.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a first wafer including a first substrate, a first dielectric layer over the first substrate, a first bonding layer over the first dielectric layer, a first via extending through the first bonding layer, and a first dummy conductive member disposed adjacent to the first via and extending partially through the first bonding layer; and a second wafer including a second bonding layer over the first bonding layer, a second via extending through the second bonding layer, a second dummy conductive member disposed adjacent to the second via and extending partially through the second bonding layer, a second dielectric layer over the second bonding layer, and a second substrate over the second dielectric layer, wherein the second bonding layer, the second via and the second dummy conductive member are respectively bonded to the first bonding layer, the first via and the first dummy conductive member.

In some embodiments, the first dummy conductive member is vertically aligned with the second dummy conductive member.

In some embodiments, a cross-sectional area of the first dummy conductive member is substantially less than or equal to 25% of a cross-sectional area of the first bonding layer.

In some embodiments, a total of the cross-sectional area of the first dummy conductive member and a cross-sectional area of the first via is substantially less than or equal to 25% of the cross-sectional area of the first bonding layer.

In some embodiments, a cross-sectional area of the second dummy conductive member is substantially less than or equal to 25% of a cross-sectional area of the second bonding layer.

In some embodiments, a total of the cross-sectional area of the second dummy conductive member and a cross-sectional area of the second via is substantially less than or equal to 25% of the cross-sectional area of the second bonding layer.

In some embodiments, a cross section of the first dummy conductive member and a cross section of the second dummy conductive member respectively have a circular, quadrilateral, polygonal or annular shape.

In some embodiments, the first dummy conductive member and the second dummy conductive member are connected to an electrical ground.

In some embodiments, the first dummy conductive member and the second dummy conductive member are electrically isolated from the first via, the second via and circuitries in the first substrate and the second substrate.

In some embodiments, a thickness of the first dummy conductive member is substantially less than a thickness of the first via, and a thickness of the second dummy conductive member is substantially less than a thickness of the second via.

In some embodiments, the first via is surrounded by the first dummy conductive member, or the second via is surrounded by the second dummy conductive member.

In some embodiments, a thickness of the second substrate is substantially less than a thickness of the first substrate.

In some embodiments, the first dummy conductive member and the second dummy conductive member include a same material.

In some embodiments, the semiconductor structure further comprises a first conductive pad at least partially exposed through the first dielectric layer and in contact with the first via; and a second conductive pad at least partially exposed through the second dielectric layer and in contact with the second via.

Another aspect of the present disclosure provides a semiconductor structure. The semiconductor structure includes a first wafer including a first substrate, a first bonding layer over the first substrate, a first via extending through the first bonding layer, and a plurality of first dummy conductive members disposed adjacent to the first via and extending partially through the first bonding layer; and a second wafer including a second bonding layer over the first bonding layer, a second via extending through the second bonding layer, and a plurality of second dummy conductive members disposed adjacent to the second via and extending partially through the second bonding layer, wherein the first bonding layer is bonded to the second bonding layer, and the plurality of first dummy conductive members are correspondingly bonded to the plurality of second dummy conductive members.

In some embodiments, the plurality of first dummy conductive members are correspondingly and vertically aligned with the plurality of second dummy conductive members.

In some embodiments, the plurality of first dummy conductive members and the plurality of second dummy conductive members are respectively arranged in a matrix.

In some embodiments, one of the plurality of first dummy conductive members encloses another one of the plurality of first dummy conductive members, and one of the plurality of second dummy conductive members encloses another one of the plurality of second dummy conductive members.

In some embodiments, the first via is bonded to the second via.

In some embodiments, a bonding force between the first via and the second via is substantially greater than a bonding force between the first bonding layer and the second bonding layer.

Another aspect of the present disclosure provides a method of manufacturing a semiconductor structure. The method includes steps of forming a first wafer, including: providing a first substrate, a first dielectric layer over the first substrate, and a first bonding layer over the first dielectric layer; removing portions of the first bonding layer to form a first opening extending through the first bonding layer and a second opening extending partially through the first bonding layer; and disposing first conductive materials into the first opening and the second opening to form a first via and a first dummy conductive member, respectively; forming a second wafer, including: providing a second substrate, a second dielectric layer over the second substrate, and a second bonding layer over the second dielectric layer; removing portions of the second bonding layer to form a third opening extending through the second bonding layer and a fourth opening extending partially through the second bonding layer; and disposing second conductive materials into the third opening and the fourth opening to form a second via and a second dummy conductive member, respectively; bonding the second wafer to the first wafer, including: bonding the first bonding layer to the second bonding layer; bonding the first via to the second via; and bonding the first dummy conductive member to the second dummy conductive member.

In some embodiments, the bonding of the first bonding layer to the second bonding layer is performed prior to the bonding of the first via to the second via and the bonding of the first dummy conductive member to the second dummy conductive member.

In some embodiments, the bonding of the first via to the second via and the bonding of the first dummy conductive member to the second dummy conductive member are performed simultaneously.

In some embodiments, the bonding of the first bonding layer to the second bonding layer is performed at room temperature.

In some embodiments, the bonding of the first via to the second via and the bonding of the first dummy conductive member to the second dummy conductive member are performed at a temperature substantially above room temperature and less than or equal to 200° C.

In some embodiments, the bonding of the first via to the second via and the bonding of the first dummy conductive member to the second dummy conductive member include heating the first wafer and the second wafer to a temperature substantially above room temperature and less than or equal to 200° C.

In some embodiments, the bonding of the first dummy conductive member to the second dummy conductive member includes expanding the first dummy conductive member and the second dummy conductive member toward each other.

In some embodiments, the bonding of the first via to the second via includes expanding the first via and the second via toward each other.

In some embodiments, a coefficient of thermal expansion (CTE) of the first dummy conductive member is substantially greater than a CTE of the first bonding layer, and a CTE of the second dummy conductive member is substantially greater than a CTE of the second bonding layer.

In some embodiments, the first dummy conductive member is formed in the first bonding layer by the disposing of the first conductive materials prior to the bonding of the first dummy conductive member to the second dummy conductive member.

In some embodiments, the second dummy conductive member is formed in the second bonding layer by the disposing of the second conductive materials prior to the bonding of the first dummy conductive member to the second dummy conductive member.

In some embodiments, a first void is formed between the first via and the second via after or during the bonding of the first bonding layer to the second bonding layer and before the bonding of the first via to the second via, and a second void is formed between the first dummy conductive member and the second dummy conductive member after or during the bonding of the first bonding layer to the second bonding layer and before the bonding of the first dummy conductive member to the second dummy conductive member.

In some embodiments, the first void and the second void are formed simultaneously.

In some embodiments, the first void and the second void extend partially through the first bonding layer and the second bonding layer.

In some embodiments, the bonding of the first bonding layer to the second bonding layer and the bonding of the first dummy conductive member to the second dummy conductive member are performed by a hybrid bonding.

In conclusion, a semiconductor structure includes two wafers bonded to each other by bonding layers and dummy conductive members surrounded by the bonding layers. Because the dummy conductive members are in a predetermined density, a bonding strength between the two wafers is increased or improved. Since the bonding strength is increased or improved by including the dummy conductive members in the predetermined density, delamination of the two wafers caused by subsequent processes such as grinding of the wafers can be minimized or prevented. Therefore, an overall structure and reliability of the semiconductor structure is improved.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

FIGS. 14 through 39 illustrate cross-sectional views of intermediate stages in the formation of a semiconductor structure in accordance with some embodiments of the present disclosure.

DETAILED DESCRIPTION

Figure 1:
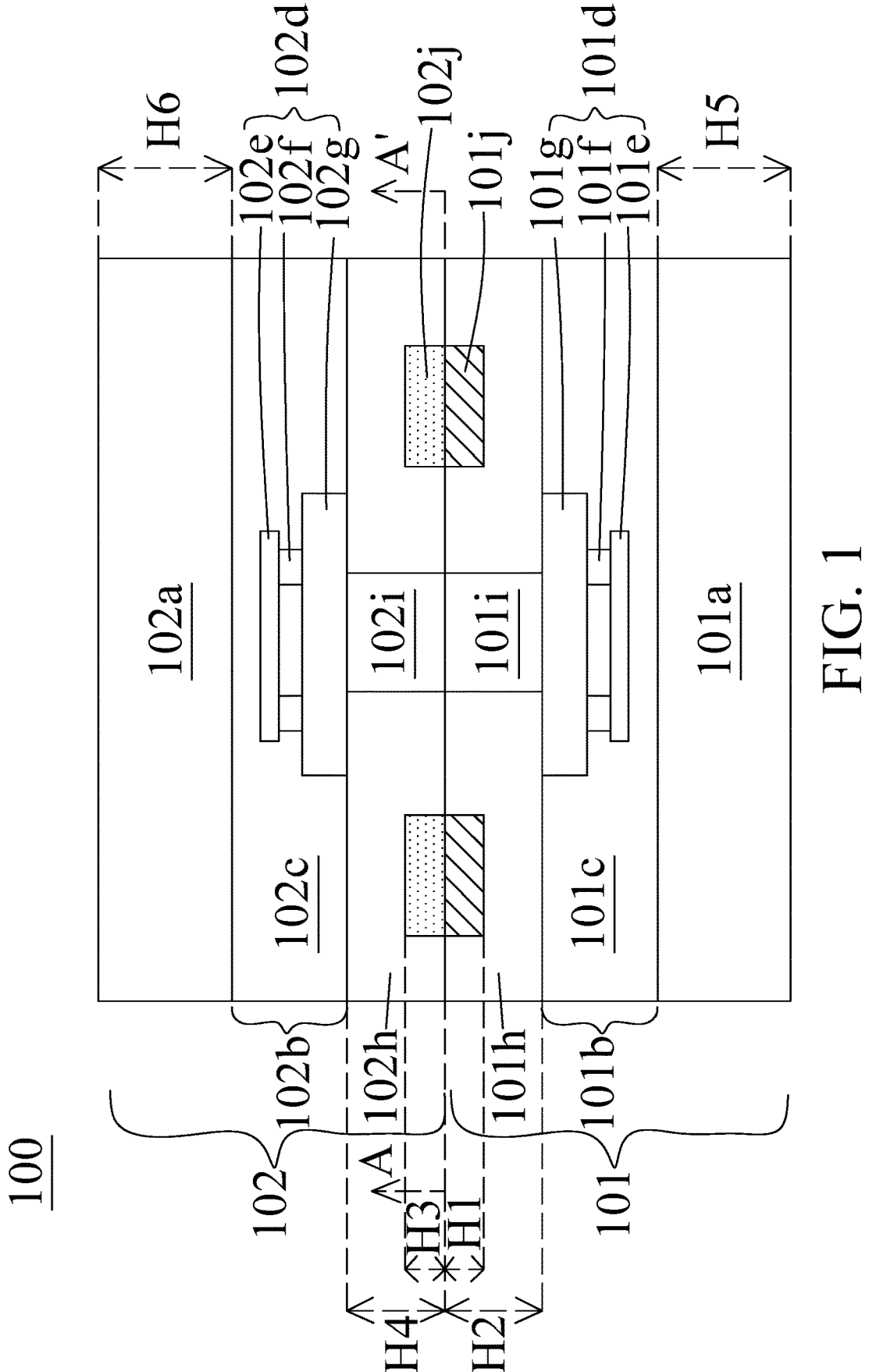
FIG. 1 is a cross-sectional view of a first semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a first semiconductor structure 100 in accordance with some embodiments of the present disclosure. In some embodiments, the first semiconductor structure 100 is a bonded structure or a part of a bonded structure. In some embodiments, the first semiconductor structure 100 is a part of a package or a device.

In some embodiments, the first semiconductor structure 100 includes a first wafer 101 and a second wafer 102 stacked over the first wafer 101. In some embodiments, the first wafer 101 is a workpiece that includes various features formed in or over the first wafer 101. In some embodiments, the first wafer 101 is in various stages of fabrication and is processed using various processes. In some embodiments, the first wafer 101 includes a variety of electrical circuits suitable for a particular application. In some embodiments, a top surface of the first wafer 101 has a circular shape or any other suitable shape.

In some embodiments, the first wafer 101 includes a first substrate 101a, a first interconnect layer 101b over the first substrate 101a, and a first bonding layer 101h over the first interconnect layer 101b. In some embodiments, the first substrate 101a is a semiconductive layer. In some embodiments, the first substrate 101a includes semiconductive material such as silicon, germanium, gallium, arsenic, or a combination thereof. In some embodiments, the first substrate 101a is a silicon substrate.

In some embodiments, electrical devices or components (e.g., various N-type metal-oxide semiconductor (NMOS) and/or P-type metal-oxide semiconductor (PMOS) devices, capacitors, resistors, diodes, photodiodes, fuses, and/or the like) are formed in or over the first substrate 101a and configured to electrically connect to an external circuitry.

In some embodiments, the first interconnect layer 101b is disposed over a front side of the first substrate 101a. In some embodiments, the first interconnect layer 101b includes a first dielectric layer 101c and a first interconnect structure 101d surrounded by the first dielectric layer 101c. In some embodiments, the first dielectric layer 101c is disposed above the first substrate 101a. In some embodiments, the first dielectric layer 101c includes dielectric material such as oxide, nitride, silicon dioxide, silicon nitride, silicon oxynitride, silicon carbide, polymer or the like. In some embodiments, the first dielectric layer 101c includes several dielectric layers stacked over each other. In some embodiments, each of the dielectric layers includes materials that are same as or different from materials in others of the dielectric layers.

In some embodiments, the first interconnect structure 101d includes a first pad portion 101e, a first via portion 101f and a first conductive pad 101g. In some embodiments, the first pad portion 101e and the first via portion 101f are embedded in the first dielectric layer 101c. In some embodiments, the first pad portion 101e extends laterally within the first dielectric layer 101c, and the first via portion 101f extends vertically within the first dielectric layer 101c. In some embodiments, the first via portion 101f is electrically coupled to the first pad portion 101e. In some embodiments, the first pad portion 101e and the first via portion 101f include conductive material such as gold, silver, copper, nickel, tungsten, aluminum, tin, alloys thereof, or the like.

In some embodiments, the first conductive pad 101g is disposed above the first pad portion 101e and the first via portion 101f. In some embodiments, the first conductive pad 101g is surrounded by the first dielectric layer 101c and is at least partially exposed through the first dielectric layer 101c. In some embodiments, the first conductive pad 101g is electrically connected to the first pad portion 101e through the first via portion 101f. In some embodiments, the first conductive pad 101g is in contact with the first via portion 101f. In some embodiments, the first conductive pad 101g includes conductive material such as gold, silver, copper, nickel, tungsten, aluminum, tin, alloys thereof, or the like. In some embodiments, a top surface of the first conductive pad 101g has a circular, quadrilateral or polygonal shape.

In some embodiments, the first bonding layer 101h is disposed over the first interconnect layer 101b and the first substrate 101a. In some embodiments, the first bonding layer 101h includes dielectric material such as oxide, nitride, silicon dioxide, silicon nitride, silicon oxynitride, silicon carbide, polymer or the like. In some embodiments, the first bonding layer 101h is configured to form a bond with another bonding layer.

In some embodiments, a first via 101i is surrounded by the first bonding layer 101h. In some embodiments, the first via 101i extends through the first bonding layer 101h and is in contact with the first conductive pad 101g. In some embodiments, the first via 101i protrudes from the first conductive pad 101g. In some embodiments, the first via 101i includes conductive material such as gold, silver, copper, nickel, tungsten, aluminum, tin, alloys thereof, or the like. In some embodiments, the first via 101i extends in a direction orthogonal to the first conductive pad 101g. In some embodiments, a cross section of the first via 101i has a circular, quadrilateral or polygonal shape.

In some embodiments, a first dummy conductive member 101j is disposed adjacent to the first via 101i and extends partially through the first bonding layer 101h. In some embodiments, the first dummy conductive member 101j is connected to an electrical ground. In some embodiments, the first dummy conductive member 101j is electrically isolated from the first via 101i, the first interconnect structure 101d, and circuitries in the first substrate 101a. In some embodiments, the first dummy conductive member 101j includes conductive material such as gold, silver, copper, nickel, tungsten, aluminum, tin, alloys thereof, or the like. In some embodiments, a thickness H1 of the first dummy conductive member 101j is substantially less than a thickness H2 of the first via 101i.

FIGS. 3 to 7 show the first dummy conductive member 101j in various shapes and various arrangements. In some embodiments, a cross section of the first dummy conductive member 101j has a circular, quadrilateral, polygonal or annular shape. In some embodiments, the first via 101i is surrounded by the first dummy conductive member 101j. In some embodiments, the first dummy conductive member 101j is arranged in a matrix.

In some embodiments, a cross-sectional area A1 of the first dummy conductive member 101j is substantially less than or equal to 25% of a cross-sectional area A2 of the first bonding layer 101h. In some embodiments, the cross-sectional area A1 is about 5% to about 20% of the cross-sectional area A2. In some embodiments, a total of the cross-sectional area A1 of the first dummy conductive member 101j and a cross-sectional area A3 of the first via 101i is substantially less than or equal to 25% of the cross-sectional area A2 of the first bonding layer 101h. In some embodiments, a total of the cross-sectional area A1 and the cross-sectional area A3 is about 5% to about 20% of the cross-sectional area A2.

Referring back to FIG. 1, the second wafer 102 is a workpiece that includes various features formed in or over the second wafer 102. In some embodiments, the second wafer 102 is in various stages of fabrication and is processed using various processes. In some embodiments, the second wafer 102 includes a variety of electrical circuits suitable for a particular application. In some embodiments, a top surface of the second wafer 102 has a circular shape or any other suitable shape.

In some embodiments, the second wafer 102 includes a second substrate 102a, a second interconnect layer 102b under the second substrate 102a, and a second bonding layer 102h under the second interconnect layer 102b. In some embodiments, the second substrate 102a is a semiconductive layer. In some embodiments, the second substrate 102a includes semiconductive material such as silicon, germanium, gallium, arsenic, or a combination thereof. In some embodiments, the second substrate 102a is a silicon substrate. In some embodiments, a thickness H6 of the second substrate 102a is substantially less than a thickness H5 of the first substrate 101a.

In some embodiments, electrical devices or components (e.g., various N-type metal-oxide semiconductor (NMOS) and/or P-type metal-oxide semiconductor (PMOS) devices, capacitors, resistors, diodes, photodiodes, fuses, and/or the like) are subsequently formed in or over the second substrate 102a and configured to electrically connect to an external circuitry.

In some embodiments, the second interconnect layer 102b is disposed between the second substrate 102a and the second bonding layer 102h. In some embodiments, the second interconnect layer 102b includes a second dielectric layer 102c and a second interconnect structure 102d surrounded by the second dielectric layer 102c. In some embodiments, the second dielectric layer 102c is disposed between the second substrate 102a and the second bonding layer 102h. In some embodiments, the second dielectric layer 102c includes dielectric material such as oxide, nitride, silicon dioxide, silicon nitride, silicon oxynitride, silicon carbide, polymer or the like. In some embodiments, the second dielectric layer 102c includes several dielectric layers stacked over each other. In some embodiments, each of the dielectric layers includes materials that are same as or different from materials in others of the dielectric layers.

In some embodiments, the second interconnect structure 102d includes a second pad portion 102e, a second via portion 102f and a second conductive pad 102g. In some embodiments, the second pad portion 102e and the second via portion 102f are embedded in the second dielectric layer 102c. In some embodiments, the second pad portion 102e extends laterally within the second dielectric layer 102c, and the second via portion 102f extends vertically within the second dielectric layer 102c. In some embodiments, the second via portion 102f is electrically coupled to the second pad portion 102e. In some embodiments, the second pad portion 102e and the second via portion 102f include conductive material such as gold, silver, copper, nickel, tungsten, aluminum, tin, alloys thereof, or the like.

In some embodiments, the second conductive pad 102g is disposed under the second pad portion 102e and the second via portion 102f. In some embodiments, the second conductive pad 102g is surrounded by the second dielectric layer 102c and is at least partially exposed through the second dielectric layer 102c. In some embodiments, the second conductive pad 102g is electrically connected to the second pad portion 102e through the second via portion 102f. In some embodiments, the second conductive pad 102g is in contact with the second via portion 102f. In some embodiments, the second conductive pad 102g includes conductive material such as gold, silver, copper, nickel, tungsten, aluminum, tin, alloys thereof, or the like. In some embodiments, a bottom surface of the second conductive pad 102g has a circular, quadrilateral or polygonal shape.

In some embodiments, the second bonding layer 102h is disposed over the first bonding layer 101h. In some embodiments, the second bonding layer 102h includes dielectric material such as oxide, nitride, silicon dioxide, silicon nitride, silicon oxynitride, silicon carbide, polymer or the like. In some embodiments, the second bonding layer 102h is configured to form a bond with another bonding layer. In some embodiments, the second bonding layer 102h is bonded to the first bonding layer 101h.

In some embodiments, a second via 102i is surrounded by the second bonding layer 102h. In some embodiments, the second via 102i extends through the second bonding layer 102h and is in contact with the second conductive pad 102g. In some embodiments, the second via 102i protrudes from the second conductive pad 102g. In some embodiments, the second via 102i includes conductive material such as gold, silver, copper, nickel, tungsten, aluminum, tin, alloys thereof, or the like. In some embodiments, the second via 102i extends in a direction orthogonal to the second conductive pad 102g. In some embodiments, a cross section of the second via 102i has a circular, quadrilateral or polygonal shape. In some embodiments, the second via 102i is bonded to the first via 101i. In some embodiments, a bonding force between the first via 101i and the second via 102i is substantially greater than a bonding force between the first bonding layer 101h and the second bonding layer 102h.

In some embodiments, a second dummy conductive member 102j is disposed adjacent to the second via 102i and extends partially through the second bonding layer 102h. In some embodiments, the second dummy conductive member 102j is connected to an electrical ground. In some embodiments, the second dummy conductive member 102j is electrically isolated from the second via 102i, the second interconnect structure 102d, and circuitries in the second substrate 102a.

In some embodiments, the second dummy conductive member 102j includes conductive material such as gold, silver, copper, nickel, tungsten, aluminum, tin, alloys thereof, or the like. In some embodiments, the first dummy conductive member 101j and the second dummy conductive member 102j include a same material. In some embodiments, a thickness H3 of the second dummy conductive member 102j is substantially less than a thickness H4 of the second via 102i. In some embodiments, the first dummy conductive member 101j is bonded to and vertically aligned with the second dummy conductive member 102j. In some embodiments, a bonding force between the first dummy conductive member 101j and the second dummy conductive member 102j is substantially greater than a bonding force between the first bonding layer 101h and the second bonding layer 102h.

FIGS. 8 to 12 show the second dummy conductive member 102j in various shapes and various arrangements. In some embodiments, a cross section of the second dummy conductive member 102j has a circular, quadrilateral, polygonal or annular shape. In some embodiments, the second via 102i is surrounded by the second dummy conductive member 102j. In some embodiments, the second dummy conductive member 102j is arranged in a matrix.

In some embodiments, a cross-sectional area A4 of the second dummy conductive member 102j is substantially less than or equal to 25% of a cross-sectional area A5 of the second bonding layer 102h. In some embodiments, the cross-sectional area A4 is about 5% to about 20% of the cross-sectional area A5. In some embodiments, a total of the cross-sectional area A4 of the second dummy conductive member 102j and a cross-sectional area A6 of the second via 102i is substantially less than or equal to 25% of the cross-sectional area A5 of the second bonding layer 102h. In some embodiments, a total of the cross-sectional area A4 and the cross-sectional area A6 is about 5% to about 20% of the cross-sectional area A5.

Figure 2:
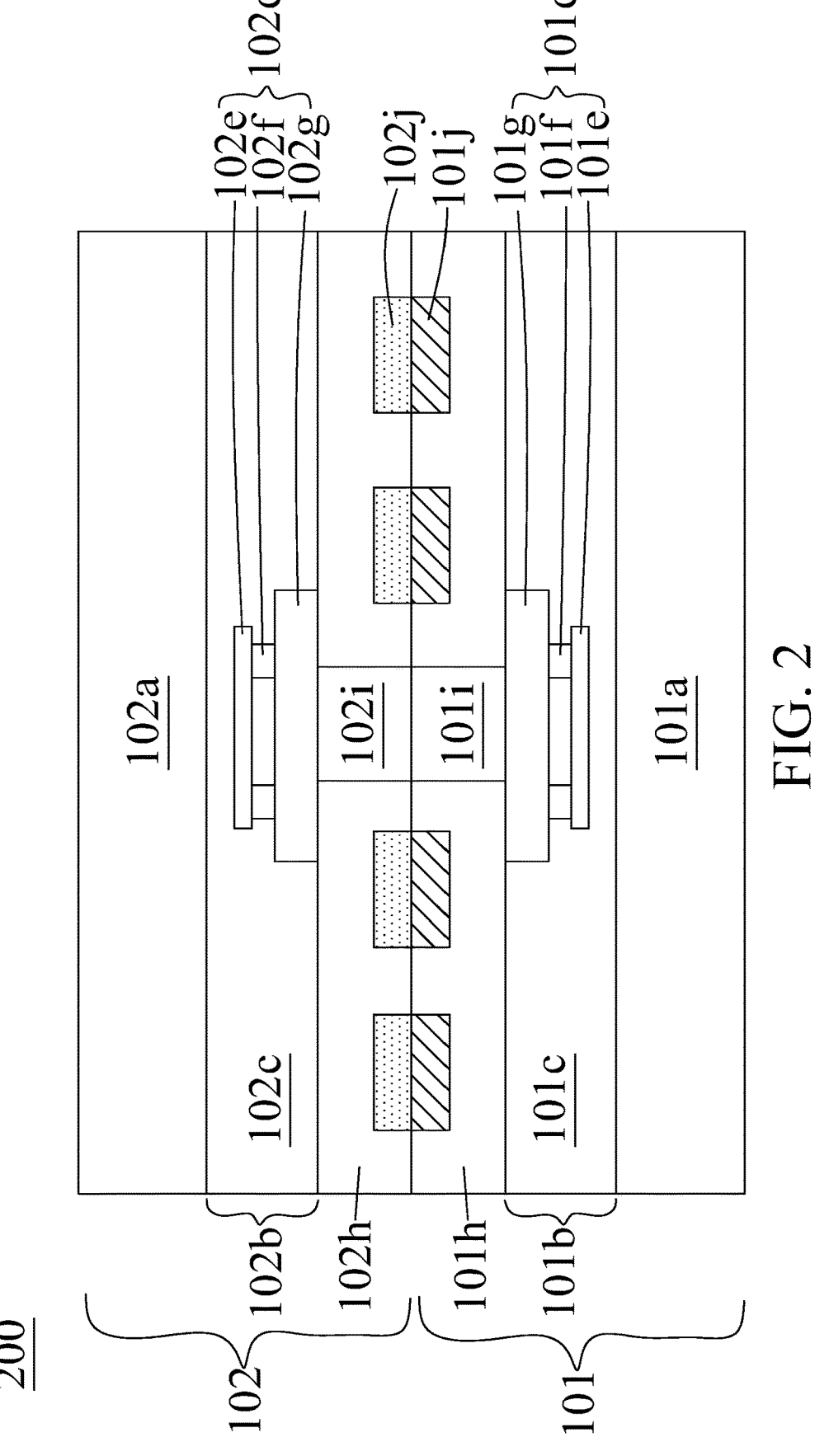
FIG. 2 is a cross-sectional view of a second semiconductor structure in accordance with some embodiments of the present disclosure.
Figure 3:
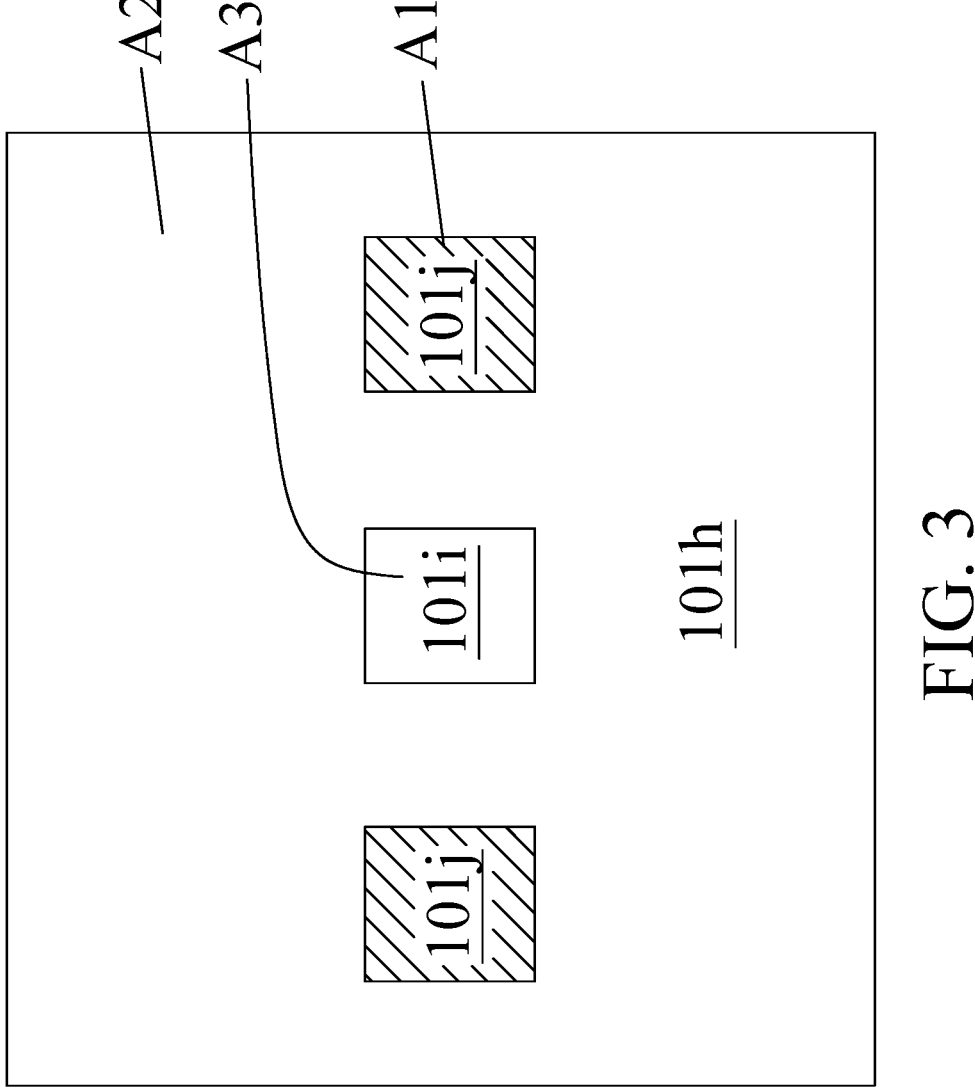
FIGS. 3 to 7 are cross-sectional top views of various embodiments of a first dummy conductive member and a first via in accordance with some embodiments of the present disclosure.
Figure 4:
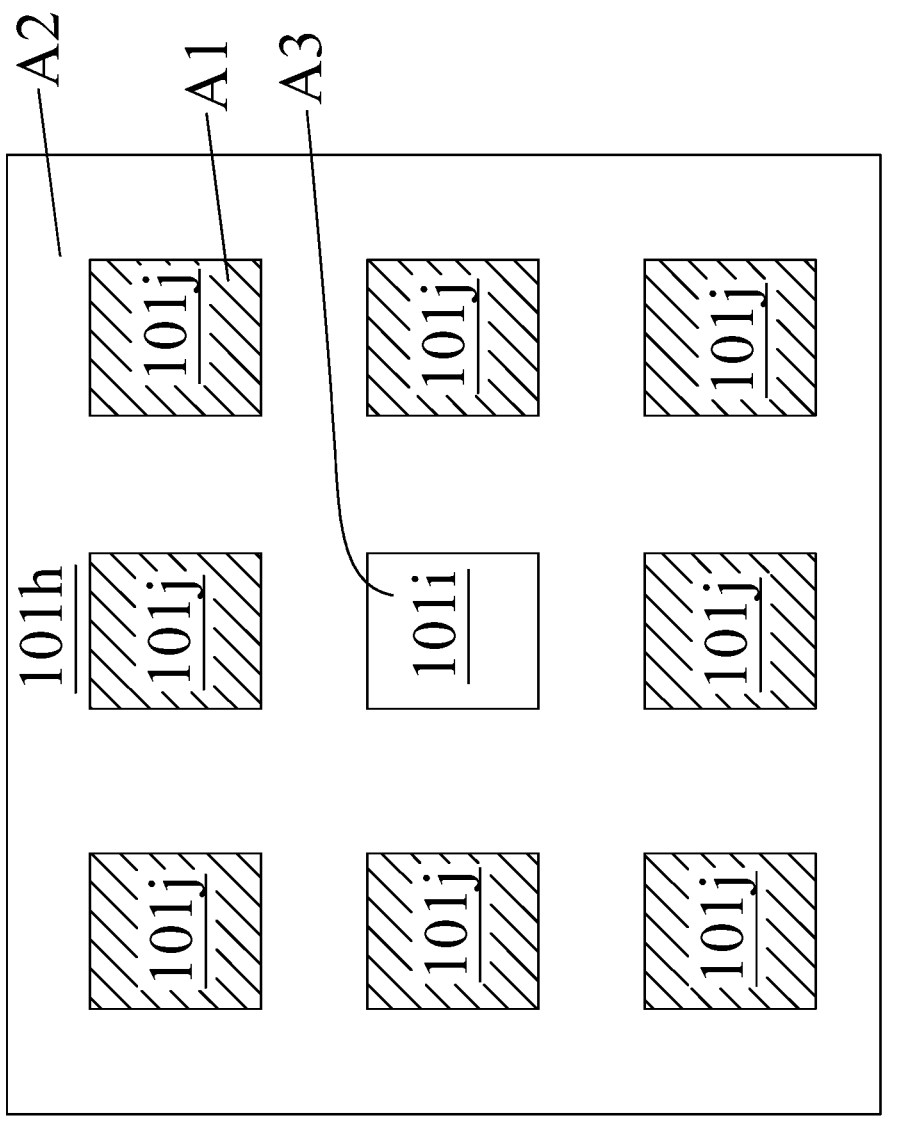
Figure 5:
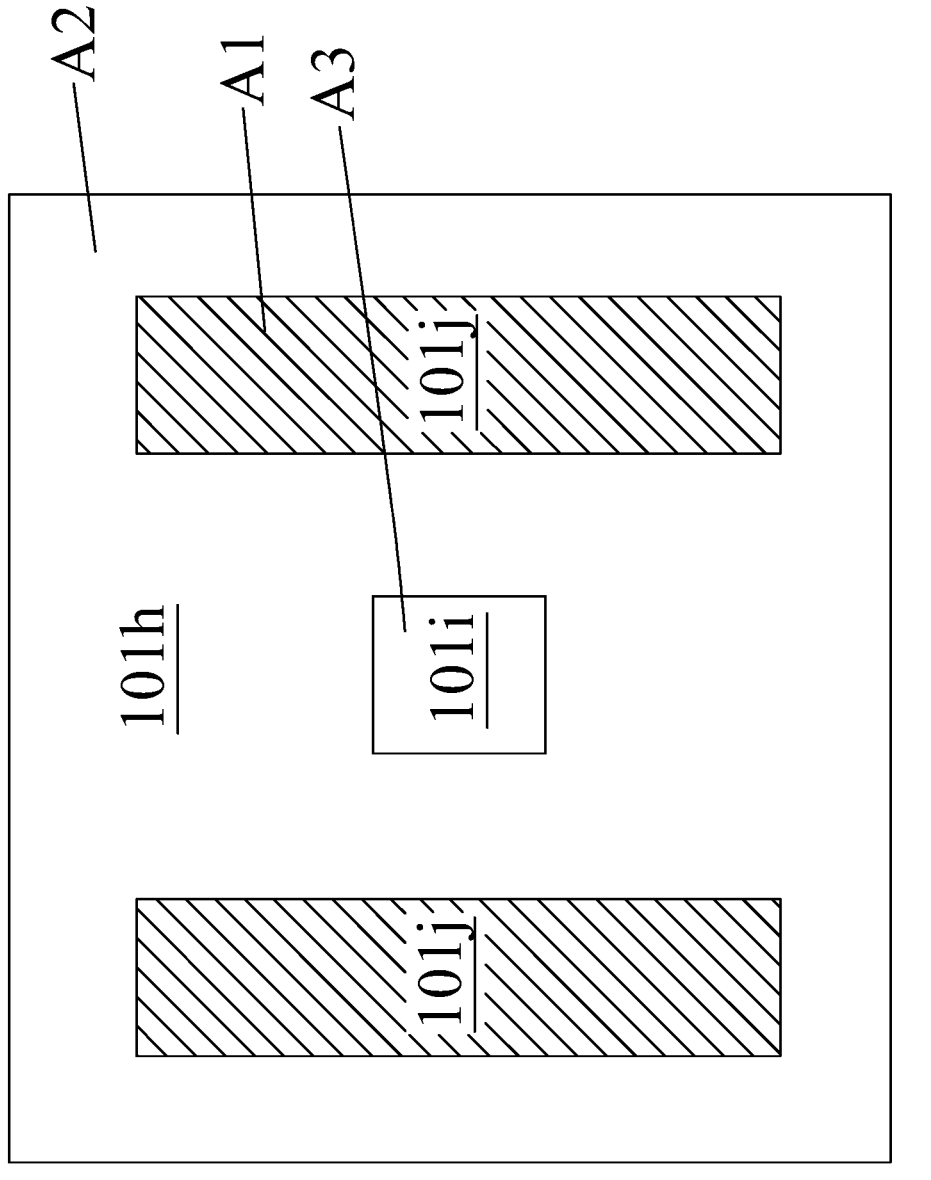
Figure 6:
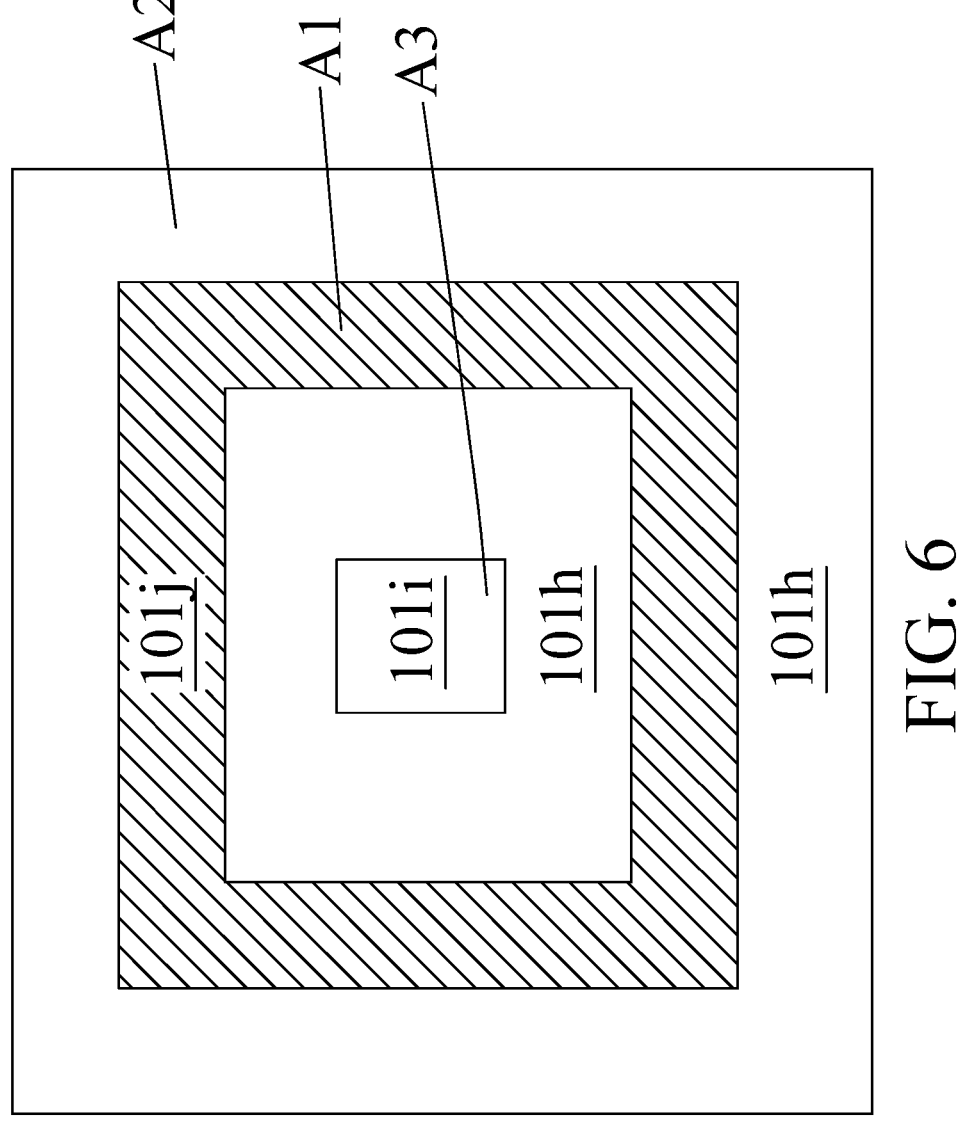
Figure 7:
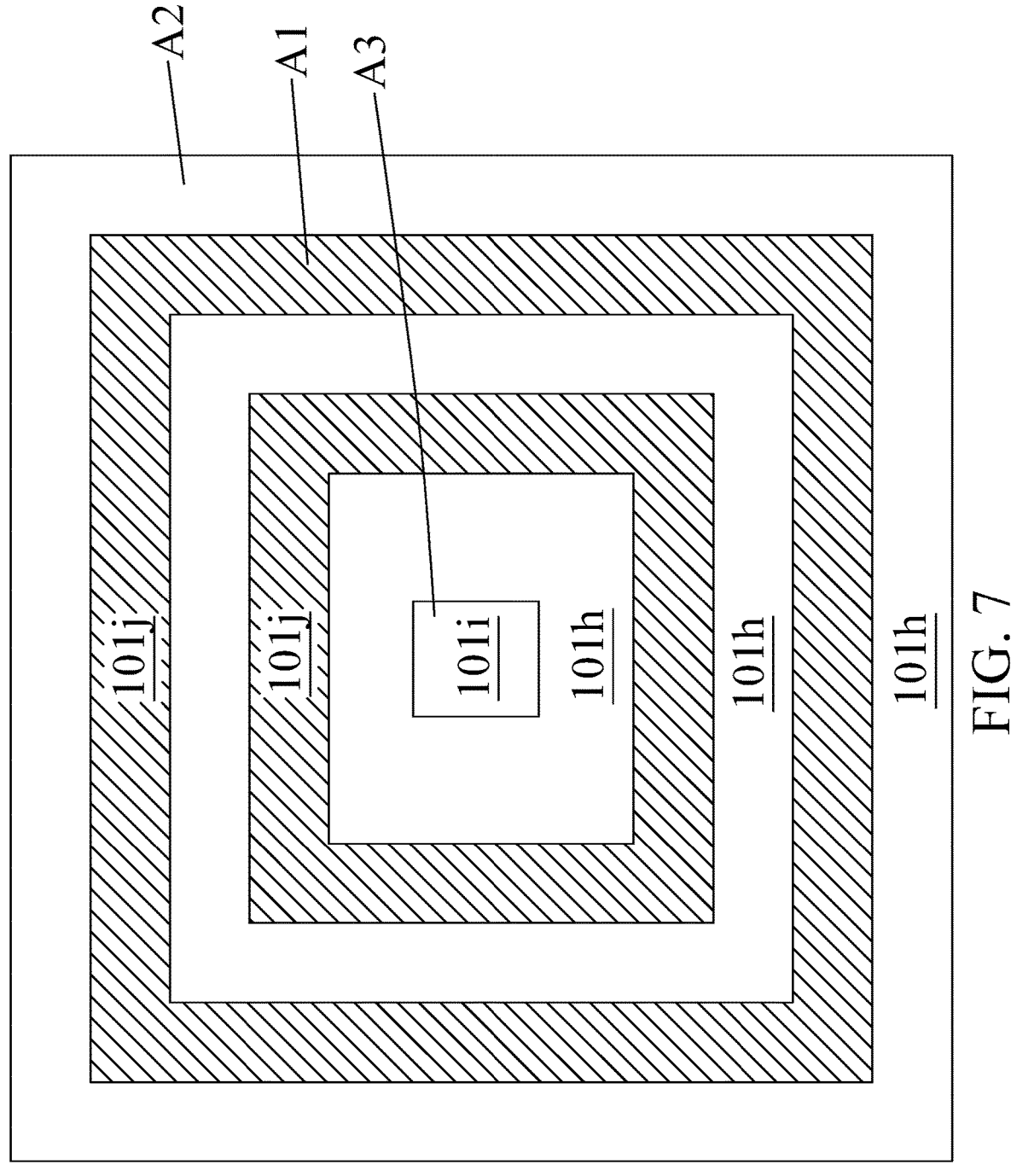
Figure 8:
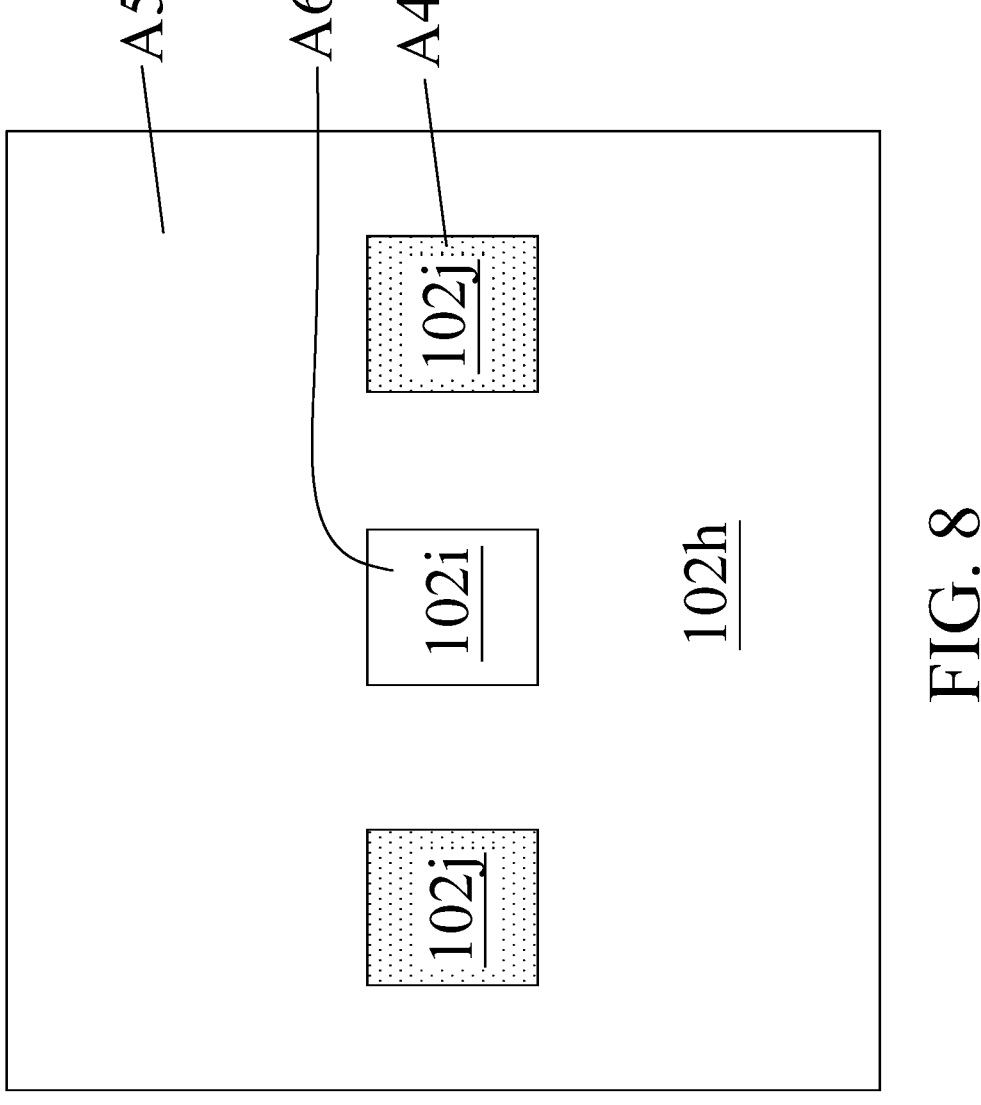
FIGS. 8 to 12 are cross-sectional top views of various embodiments of a second dummy conductive member and a second via in accordance with some embodiments of the present disclosure.
Figure 9:
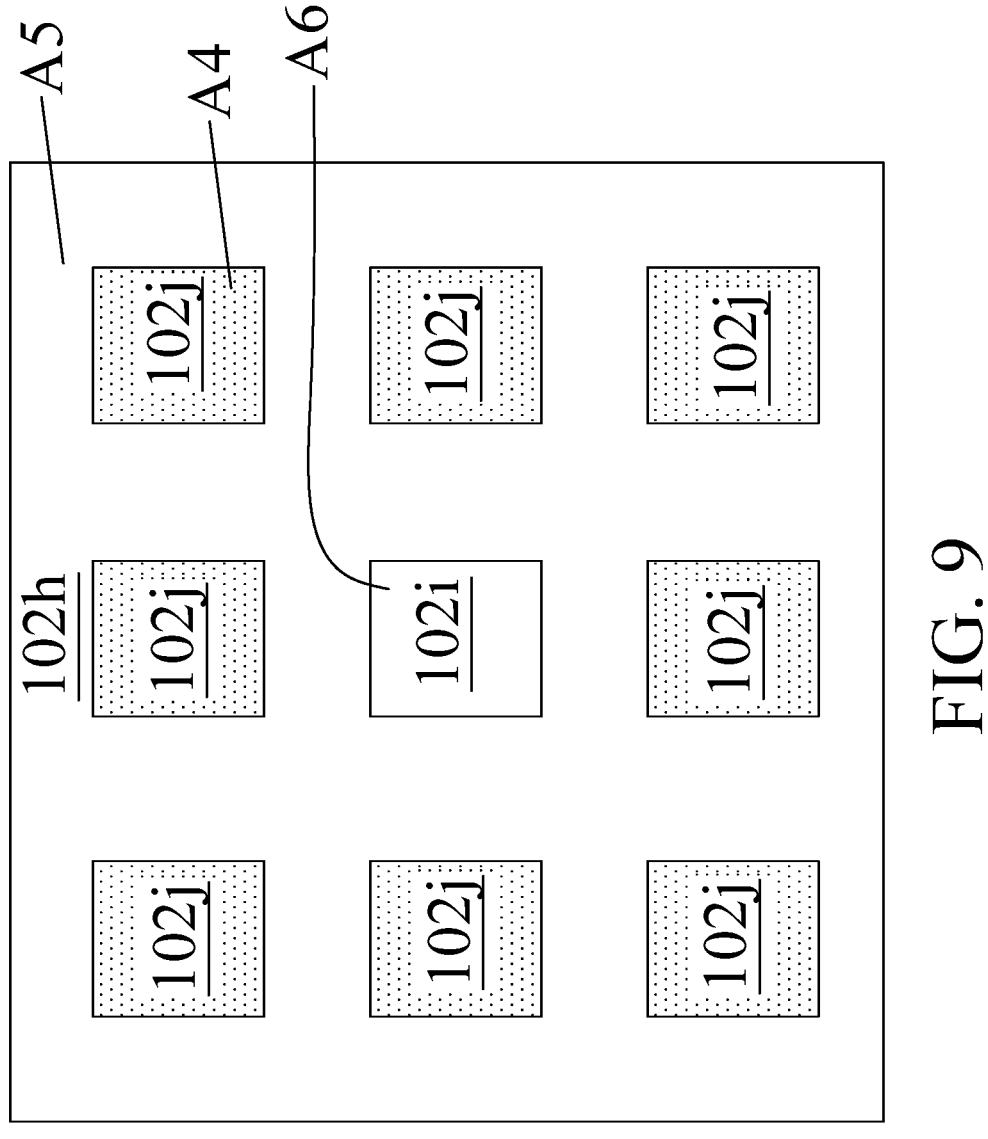
Figure 10:
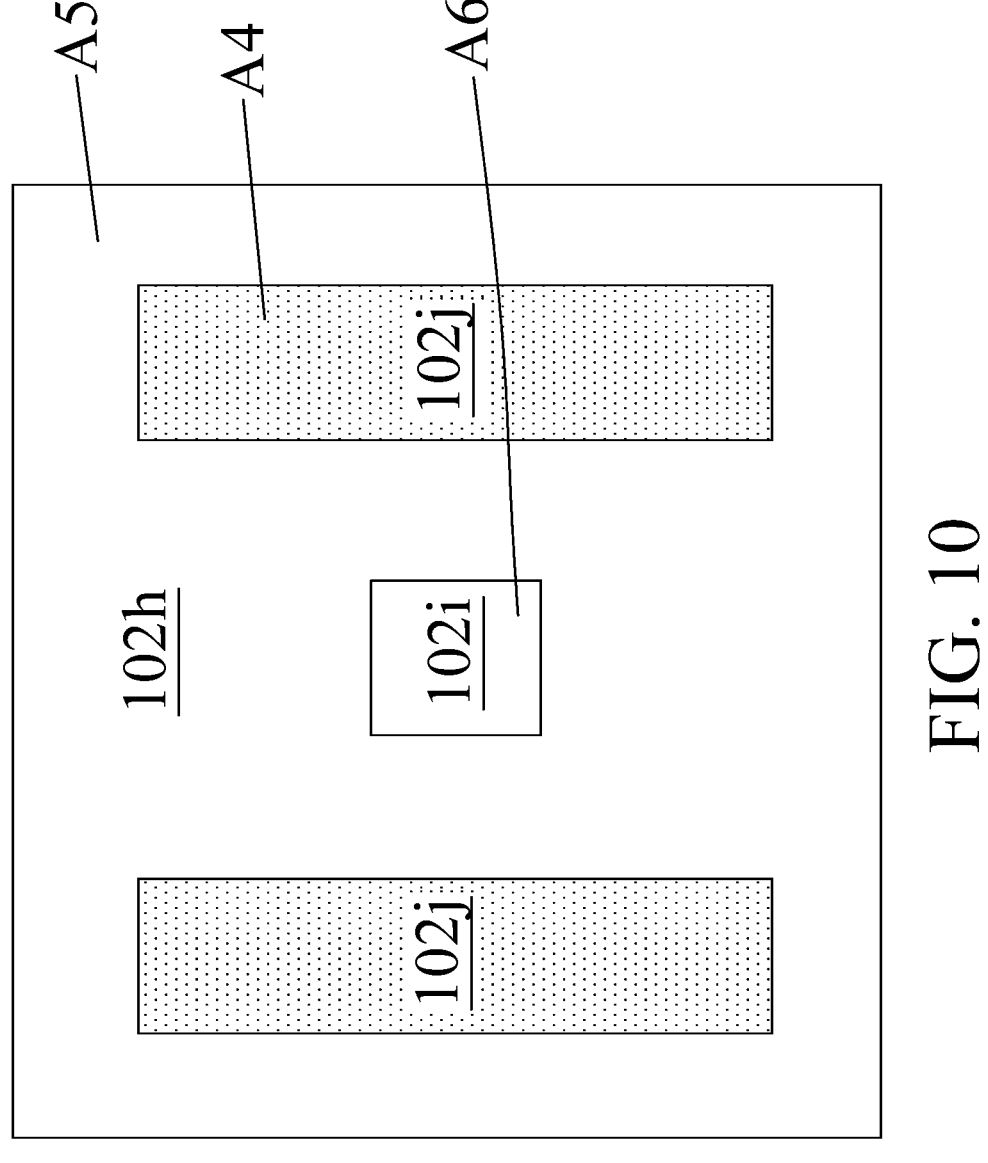
Figure 11:
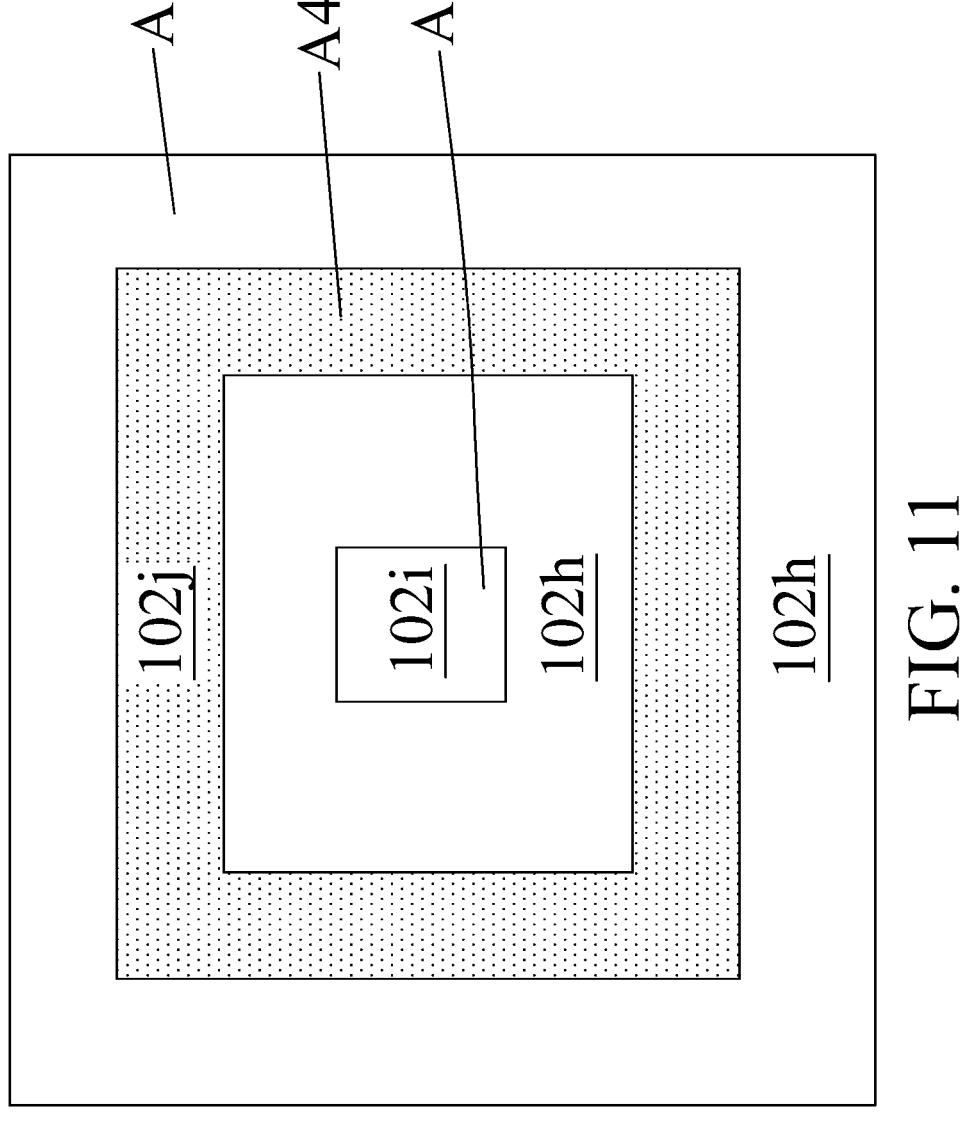
Figure 12:
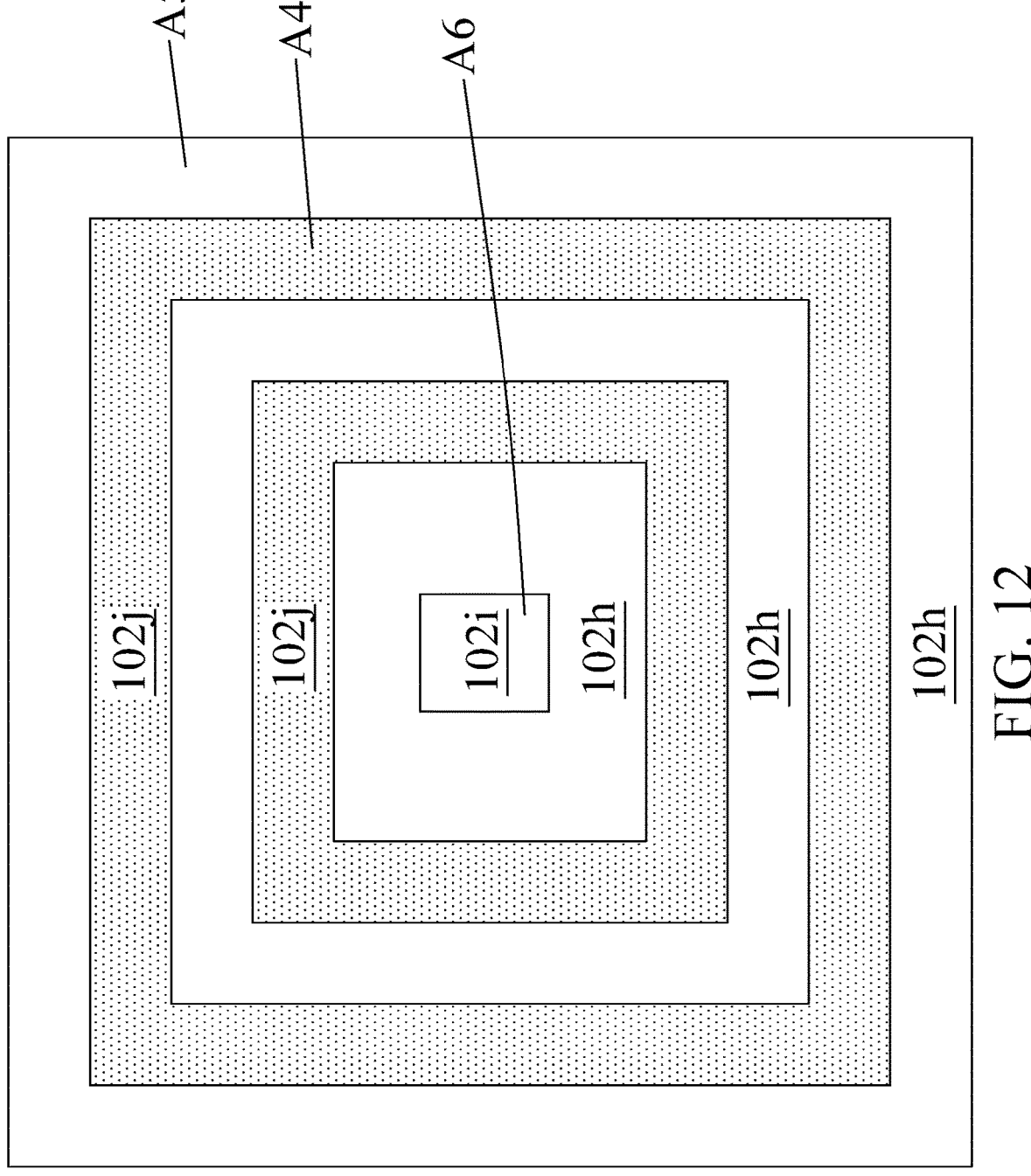

FIG. 2 is a schematic cross-sectional view of a second semiconductor structure 200 in accordance with some embodiments of the present disclosure. In some embodiments, the second semiconductor structure 200 has configurations similar to those of the first semiconductor structure 100, except the second semiconductor structure 200 includes several first dummy conductive members 101j and several second dummy conductive members 102j. The first bonding layer 101h is bonded to the second bonding layer 102h.

In some embodiments, the first dummy conductive members 101j are correspondingly bonded to and vertically aligned with the second dummy conductive members 102j. In some embodiments, one of the first dummy conductive members 101j encloses another one of the first dummy conductive members 101j, and one of the second dummy conductive members 102j encloses another one of the second dummy conductive members 102j.

Figure 13:
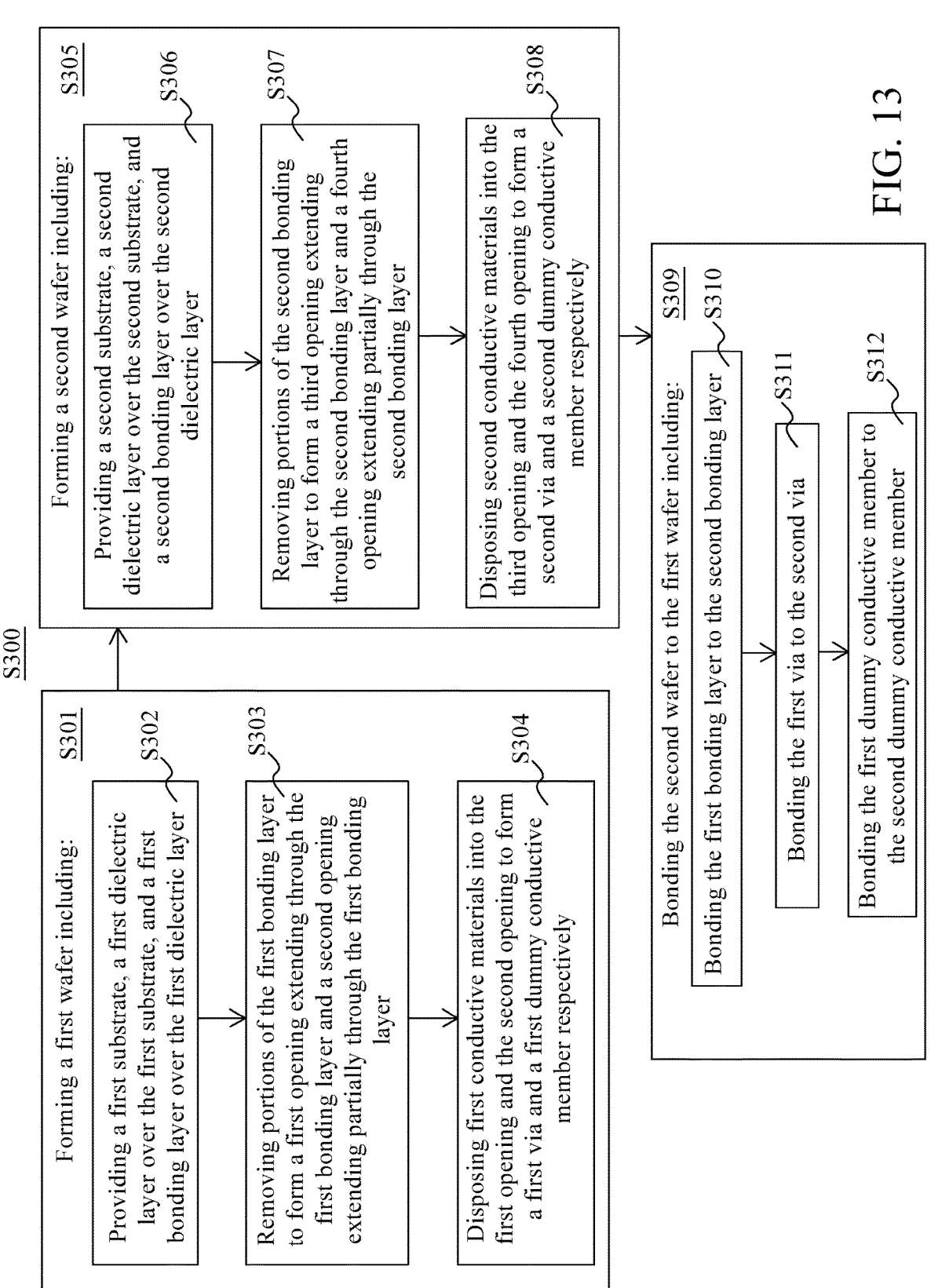
FIG. 13 is a flow diagram illustrating a method of manufacturing a semiconductor structure in accordance with some embodiments of the present disclosure.

FIG. 13 is a flow diagram illustrating a method S300 of manufacturing the first or the second semiconductor structure 100 or 200 in accordance with some embodiments of the present disclosure, and FIGS. 14 to 39 illustrate cross-sectional views of intermediate stages in the formation of the first or the second semiconductor structure 100 or 200 in accordance with some embodiments of the present disclosure.

The stages shown in FIGS. 14 to 39 are also illustrated schematically in the flow diagram in FIG. 13. In the following description, the fabrication stages shown in FIGS. 14 to 39 are discussed in reference to the process steps shown in FIG. 13. The method S300 includes a number of operations and the description and illustration are not deemed as a limitation to the sequence of the operations. The method S300 includes a number of steps (S301, S302, S303, S304, S305, S306, S307, S308, S309, S310, S311 and S312).

The method S300 includes steps of forming a first wafer (S301) including: providing a first substrate, a first dielectric layer over the first substrate, and a first bonding layer over the first dielectric layer (S302); removing portions of the first bonding layer to form a first opening extending through the first bonding layer and a second opening extending partially through the first bonding layer (S303); and disposing first conductive materials into the first opening and the second opening to form a first via and a first dummy conductive member, respectively (S304); forming a second wafer (S305) including: providing a second substrate, a second dielectric layer over the second substrate, and a second bonding layer over the second dielectric layer (S306); removing portions of the second bonding layer to form a third opening extending through the second bonding layer and a fourth opening extending partially through the second bonding layer (S307); and disposing second conductive materials into the third opening and the fourth opening to form a second via and a second dummy conductive member, respectively (S308); bonding the second wafer to the first wafer (S309) including: bonding the first bonding layer to the second bonding layer (S310); bonding the first via to the second via (S311); and bonding the first dummy conductive member to the second dummy conductive member (S312).

Figure 14:
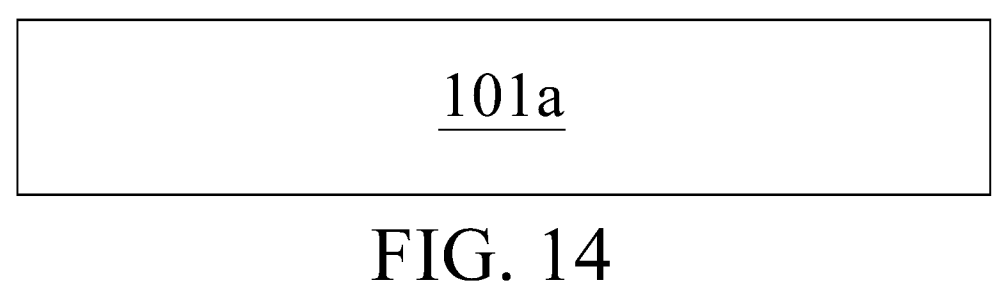

Referring to FIGS. 14 to 21, a first wafer 101 is formed according to step S301 in FIG. 13. Referring to FIGS. 14 to 17, the formation of the first wafer 101 includes providing a first substrate 101a, a first dielectric layer 101c over the first substrate 101a, and a first bonding layer 101h over the first dielectric layer 101c according to step S302 in FIG. 13. Referring to FIG. 14, the first substrate 101a is provided. In some embodiments, the first substrate 101a is a semiconductive layer. In some embodiments, the first substrate 101a includes semiconductive material such as silicon, germanium, gallium, arsenic, or a combination thereof. In some embodiments, the first substrate 101a is a silicon substrate.

Figure 15:
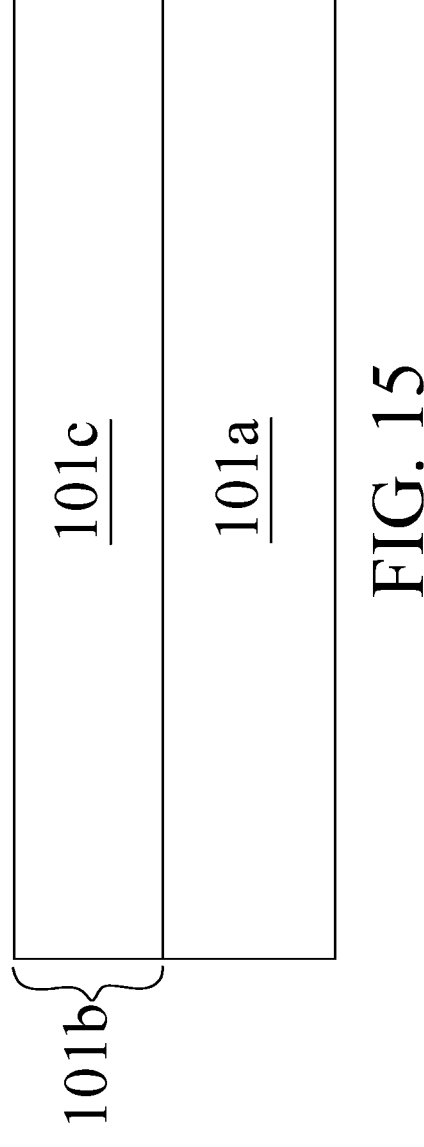

Referring to FIG. 15, the first dielectric layer 101c is formed over the first substrate 101a. In some embodiments, a first interconnect layer 101b includes the first dielectric layer 101c and is disposed over a front side of the first substrate 101a. In some embodiments, the first dielectric layer 101c is disposed above the first substrate 101a. In some embodiments, the first dielectric layer 101c includes dielectric material such as oxide, nitride, silicon dioxide, silicon nitride, silicon oxynitride, silicon carbide, polymer or the like. In some embodiments, the first dielectric layer 101c is formed by deposition, chemical vapor deposition (CVD) or another suitable process.

Figure 16:
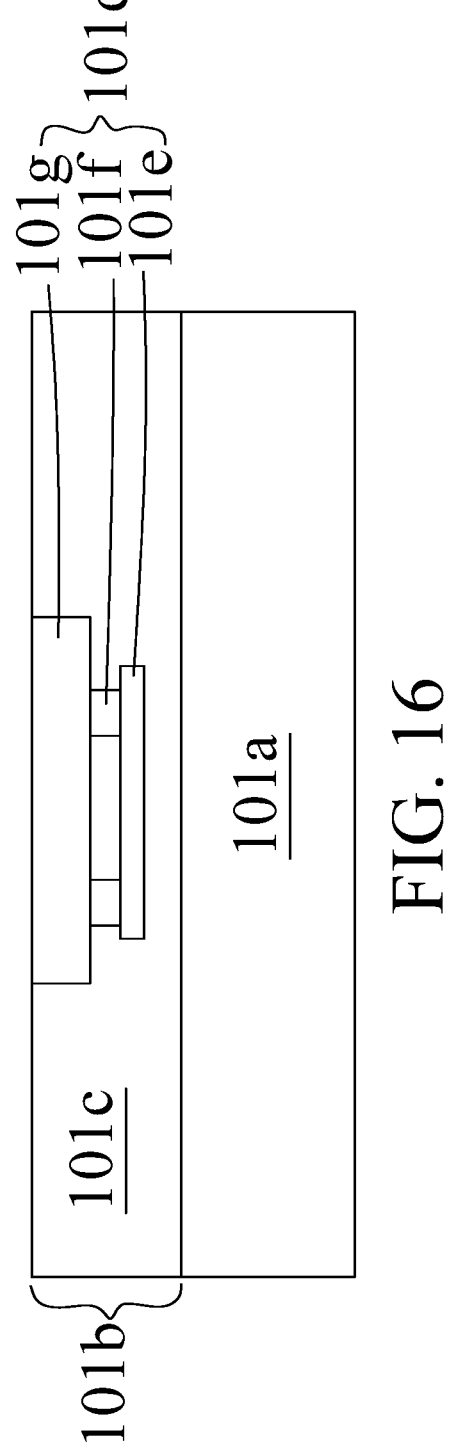

Referring to FIG. 16, a first interconnect structure 101d is formed within the first dielectric layer 101c. In some embodiments, the first interconnect layer 101b includes the first interconnect structure 101d surrounded by the first dielectric layer 101c. In some embodiments, the first interconnect structure 101d includes a first pad portion 101e, a first via portion 101f and a first conductive pad 101g. In some embodiments, the first pad portion 101e and the first via portion 101f include conductive material such as gold, silver, copper, nickel, tungsten, aluminum, tin, alloys thereof, or the like. In some embodiments, the first pad portion 101e and the first via portion 101f are formed by removing several portions of the first dielectric layer 101c to form several recesses and disposing conductive materials to fill the recesses to form the first pad portion 101e and the first via portion 101f. In some embodiments, the conductive material is disposed by electroplating, sputtering or another suitable process.

In some embodiments, the first conductive pad 101g is at least partially exposed through the first dielectric layer 101c. In some embodiments, the first conductive pad 101g is formed by removing a portion of the first dielectric layer 101c to form a recess, and then disposing conductive material to fill the recess to form the first conductive pad 101g. In some embodiments, the conductive material is disposed by electroplating, sputtering or another suitable process.

Figure 17:
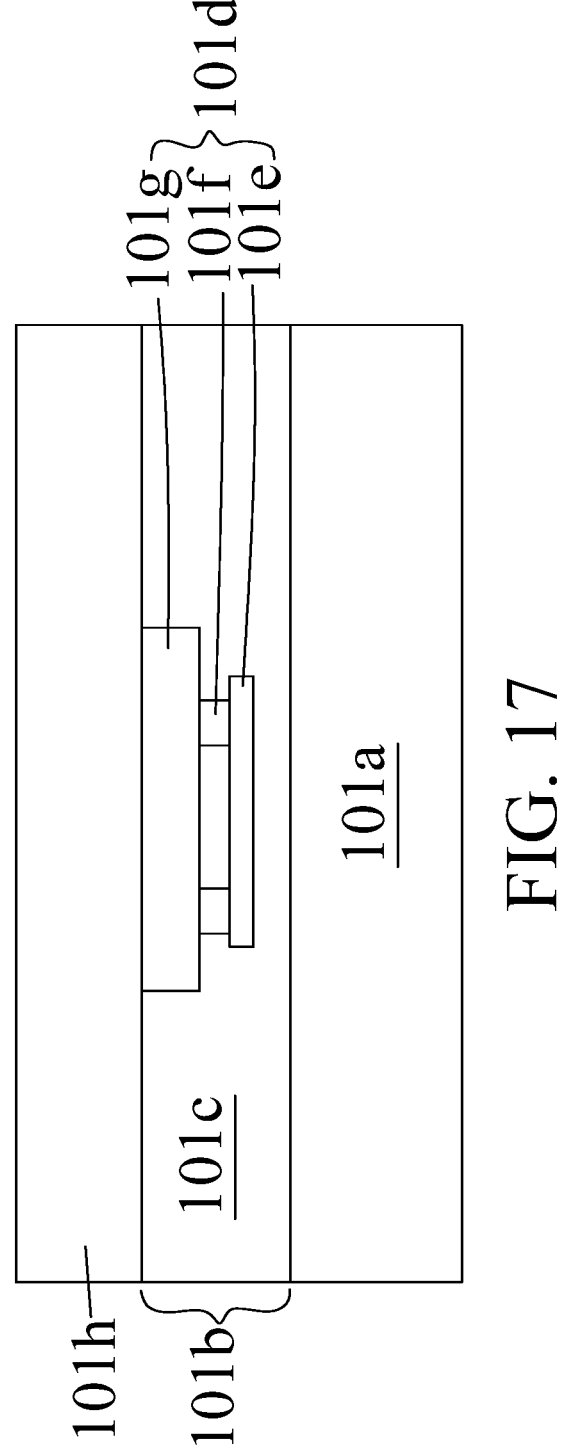

Referring to FIG. 17, the first bonding layer 101h is formed over the first dielectric layer 101c. In some embodiments, the first bonding layer 101h includes dielectric material such as oxide, nitride, silicon dioxide, silicon nitride, silicon oxynitride, silicon carbide, polymer or the like. In some embodiments, a top surface of the first conductive pad 101g is entirely covered by and in contact with the first bonding layer 101h. In some embodiments, the first bonding layer 101h is disposed by deposition, chemical vapor deposition (CVD) or another suitable process.

Figure 18:
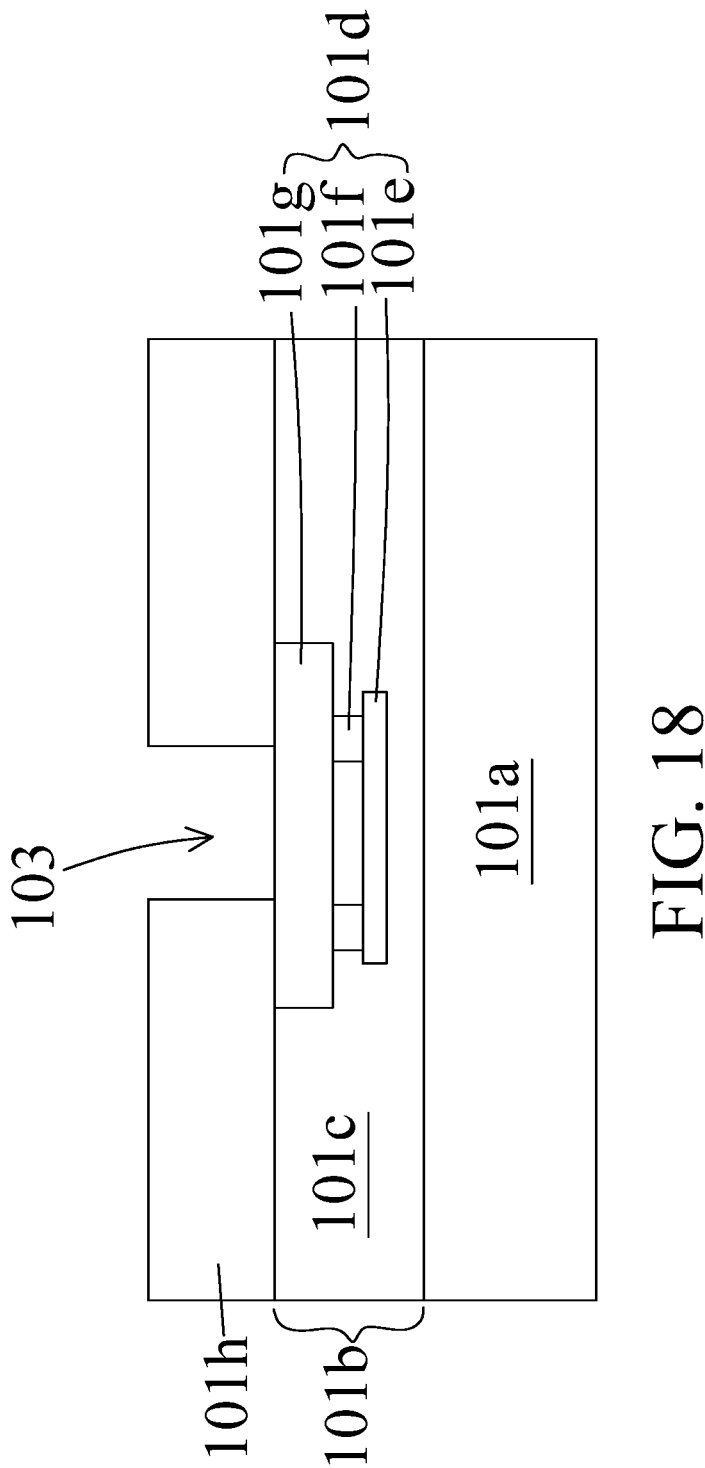
Figure 20:
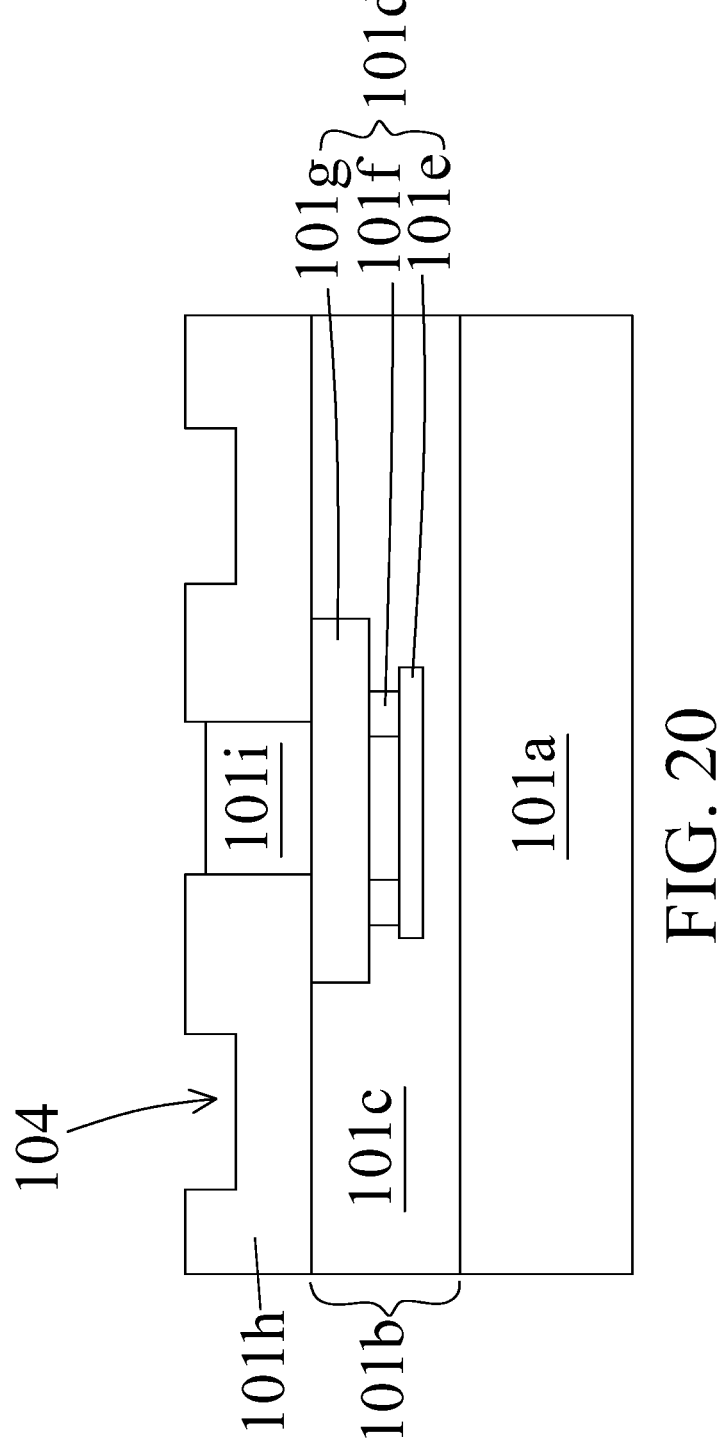

Referring to FIGS. 18 and 20, portions of the first bonding layer 101h are removed to form a first opening 103 extending through the first bonding layer 101h and a second opening 104 extending partially through the first bonding layer 101h according to step S303. In some embodiments as shown in FIG. 18, the first opening 103 extends through the first bonding layer 101h to expose at least a portion of the top surface of the first conductive pad 101g. In some embodiments as shown in FIG. 20, the second opening 104 extends partially through the first bonding layer 101h. In some embodiments, the portions of the first bonding layer 101h are removed by etching or any other suitable process. In some embodiments, the first opening 103 and the second opening 104 are formed simultaneously or sequentially.

Figure 19:
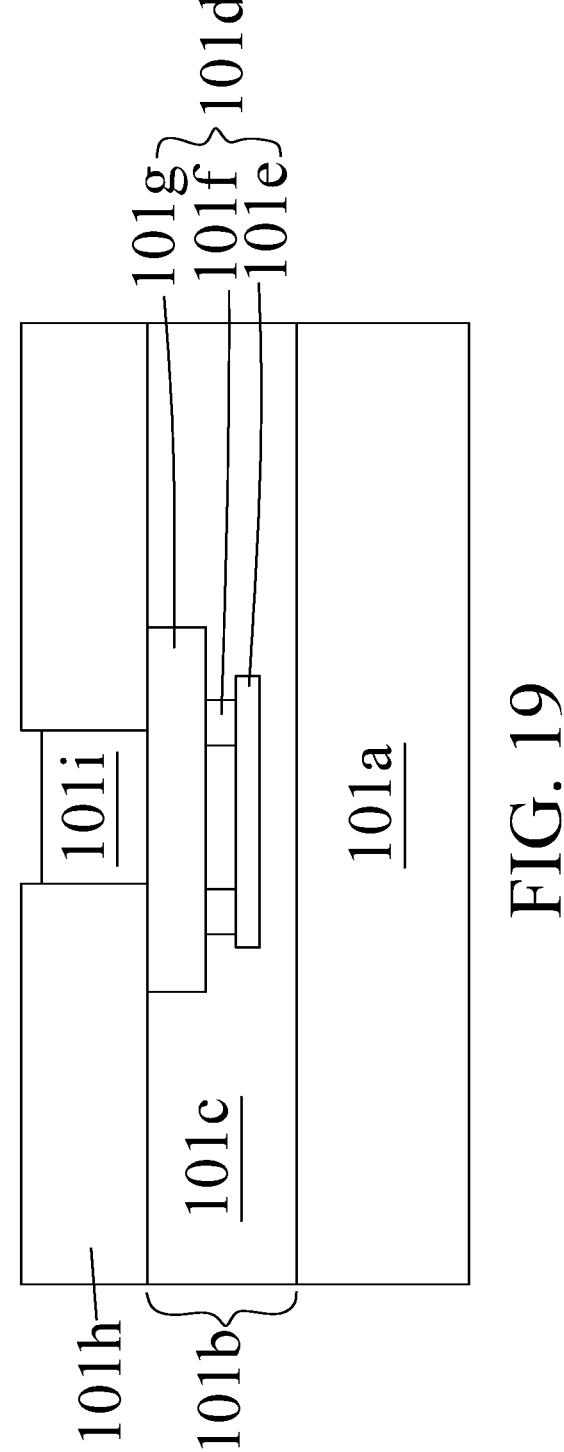
Figure 21:
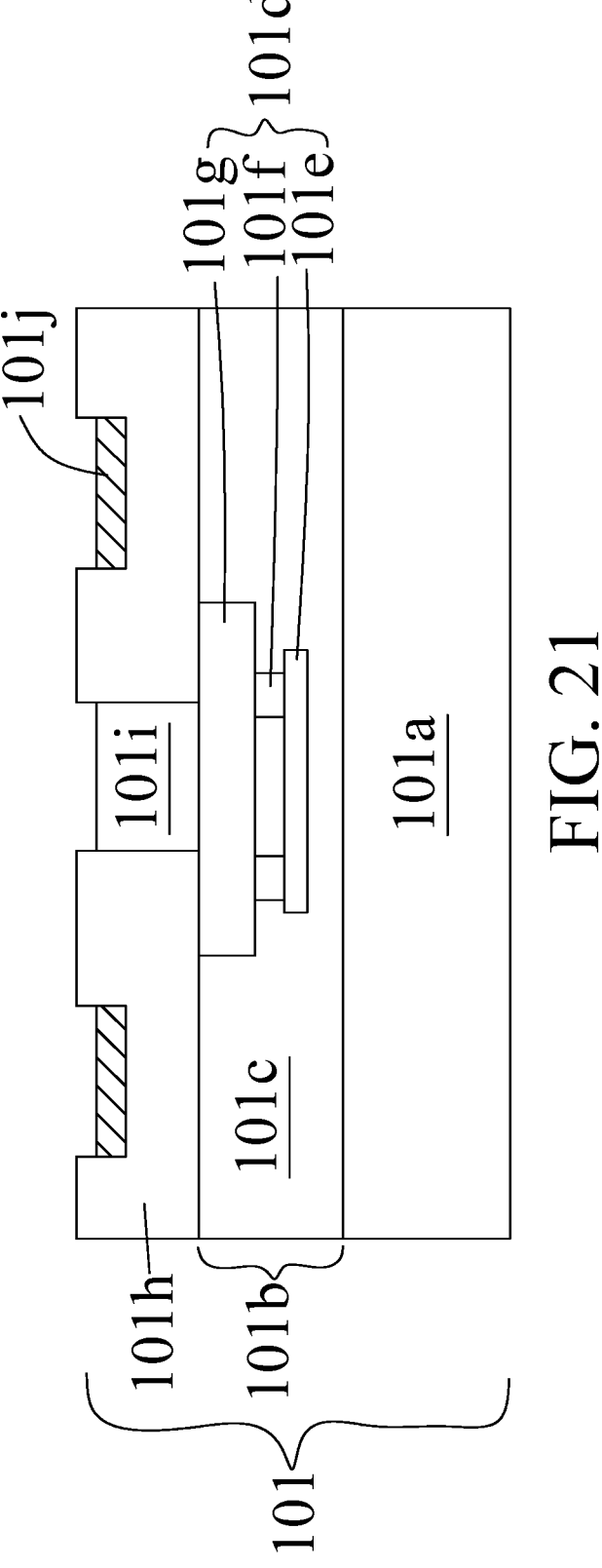

Referring to FIGS. 19 and 21, first conductive materials are disposed into the first opening 103 and the second opening 104 to form a first via 101i and a first dummy conductive member 101j, respectively according to step S304 in FIG. 13. In some embodiments, the formation of the first via 101i and the formation of the first dummy conductive member 101j are implemented simultaneously or sequentially. In some embodiments, the first conductive materials include gold, silver, copper, nickel, tungsten, aluminum, tin, alloys thereof, or the like. In some embodiments, the first conductive materials are disposed by chemical vapor deposition (CVD), physical vapor deposition (PVD), sputtering or another suitable process. In some embodiments, the first wafer 101 is formed as shown in FIG. 21.

Figure 22:
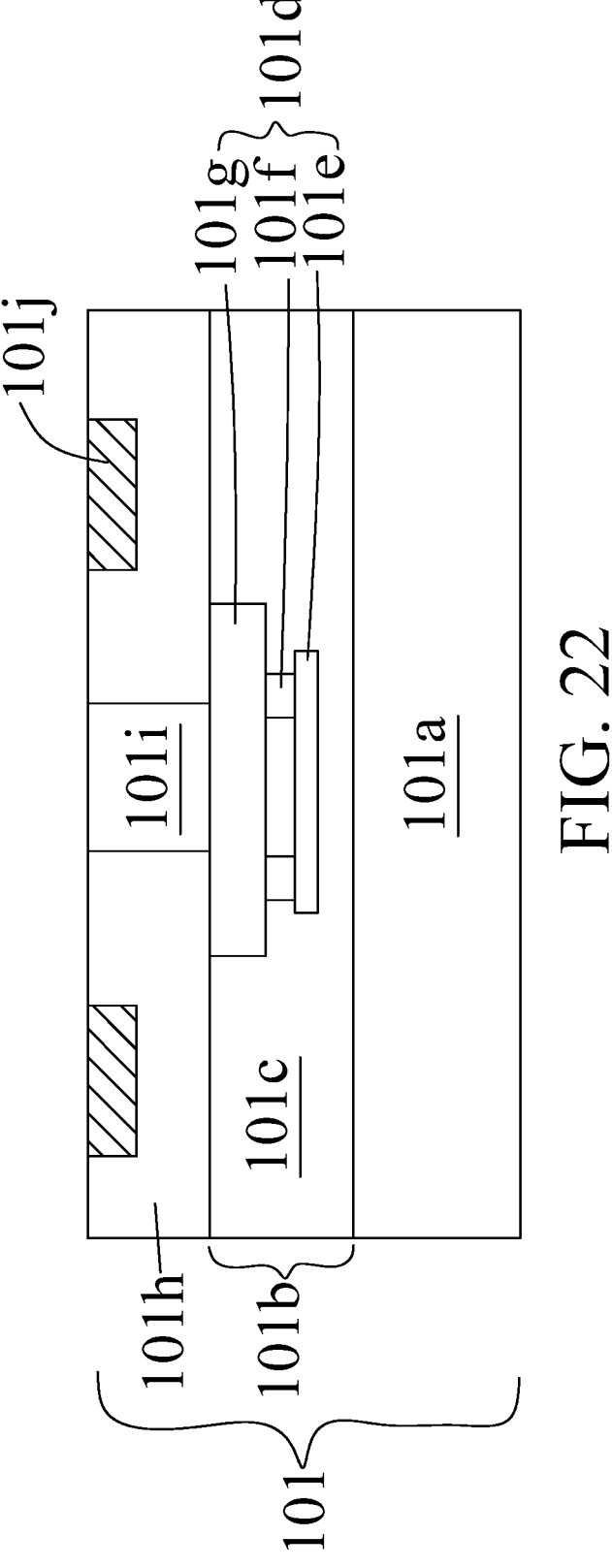

In some embodiments, the first via 101i partially fills the first opening 103, and the first dummy conductive member 101j partially fills the second opening 104, as shown in FIG. 21. In some embodiments, the first dummy conductive member 101j is formed in the first bonding layer 101h by the disposing of the first conductive materials prior to the bonding of the first dummy conductive member 101j to the second dummy conductive member 102j. In an alternative embodiment, a top surface of the first via 101i and a top surface of the first dummy conductive member 101j are coplanar with a surface of the first bonding layer 101h, as shown in FIG. 22.

Figure 23:
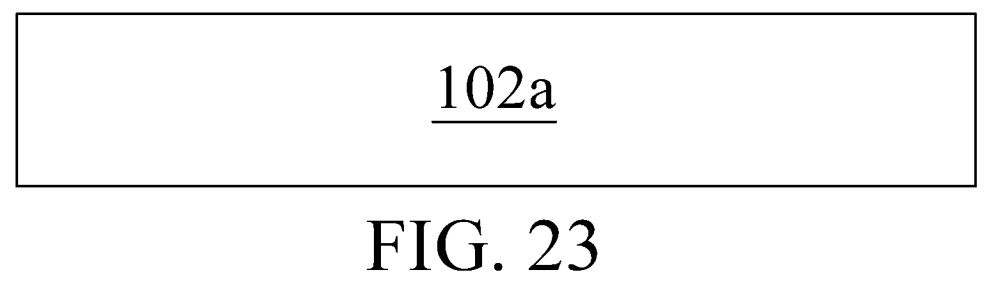

Referring to FIGS. 23 to 30, a second wafer 102 is formed according to step S305 in FIG. 13. Referring to FIGS. 23 to 26, the formation of the second wafer 102 includes providing a second substrate 102a, a second dielectric layer 102c over the second substrate 102a, and a second bonding layer 102h over the second dielectric layer 102c according to step S306 in FIG. 13. Referring to FIG. 23, the second substrate 102a is provided. In some embodiments, the second substrate 102a is a semiconductive layer. In some embodiments, the second substrate 102a includes semiconductive material such as silicon, germanium, gallium, arsenic, or a combination thereof. In some embodiments, the second substrate 102a is a silicon substrate.

Figure 24:
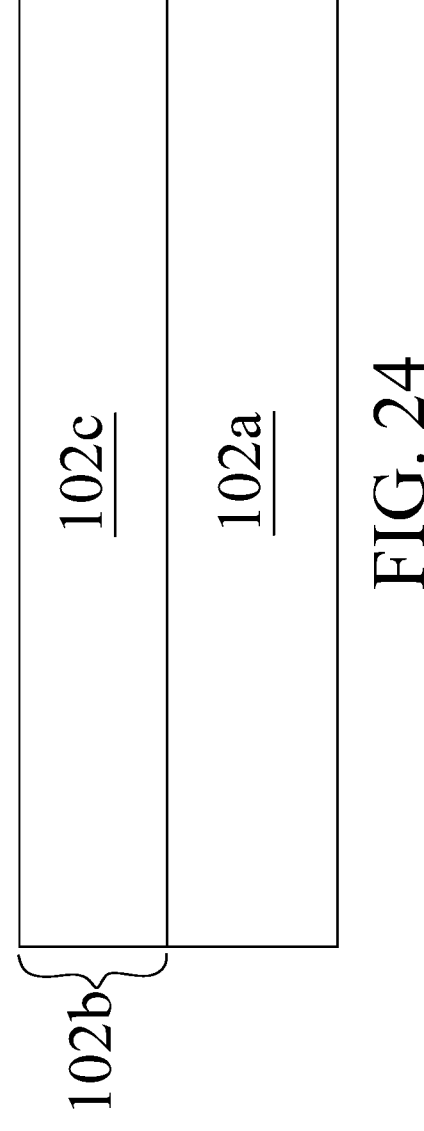

Referring to FIG. 24, the second dielectric layer 102c is formed over the second substrate 102a. In some embodiments, a second interconnect layer 102b includes the second dielectric layer 102c and is disposed over a front side of the second substrate 102a. In some embodiments, the second dielectric layer 102c is disposed above the second substrate 102a. In some embodiments, the second dielectric layer 102c includes dielectric material such as oxide, nitride, silicon dioxide, silicon nitride, silicon oxynitride, silicon carbide, polymer or the like. In some embodiments, the second dielectric layer 102c is formed by deposition, chemical vapor deposition (CVD) or another suitable process.

Figure 25:
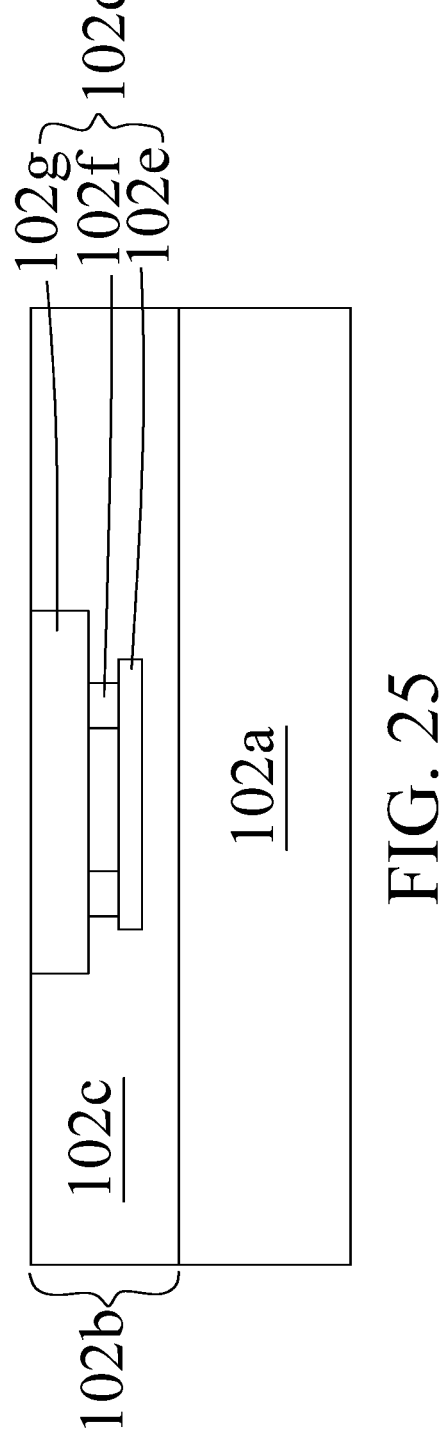

Referring to FIG. 25, a second interconnect structure 102*d* is formed within the second dielectric layer 102*c*. In some embodiments, the second interconnect layer 102*b* includes the second interconnect structure 102*d* surrounded by the second dielectric layer 102*c*. In some embodiments, the second interconnect structure 102*d* includes a second pad portion 102*e*, a second via portion 102*f* and a second conductive pad 102*g*. In some embodiments, the second pad portion 102*e* and the second via portion 102*f* include conductive material such as gold, silver, copper, nickel, tungsten, aluminum, tin, alloys thereof, or the like. In some embodiments, the second pad portion 102*e* and the second via portion 102*f* are formed by removing several portions of the second dielectric layer 102*c* to form several recesses and disposing conductive materials to fill the recesses to form the second pad portion 102*e* and the second via portion 102*f*. In some embodiments, the conductive material is disposed by electroplating, sputtering or another suitable process.

In some embodiments, the second conductive pad 102*g* is at least partially exposed through the second dielectric layer 102*c*. In some embodiments, the second conductive pad 102*g* is formed by removing a portion of the second dielectric layer 102*c* to form a recess, and then disposing conductive material to fill the recess to form the second conductive pad 102*g*. In some embodiments, the conductive material is disposed by electroplating, sputtering or another suitable process.

Figure 26:
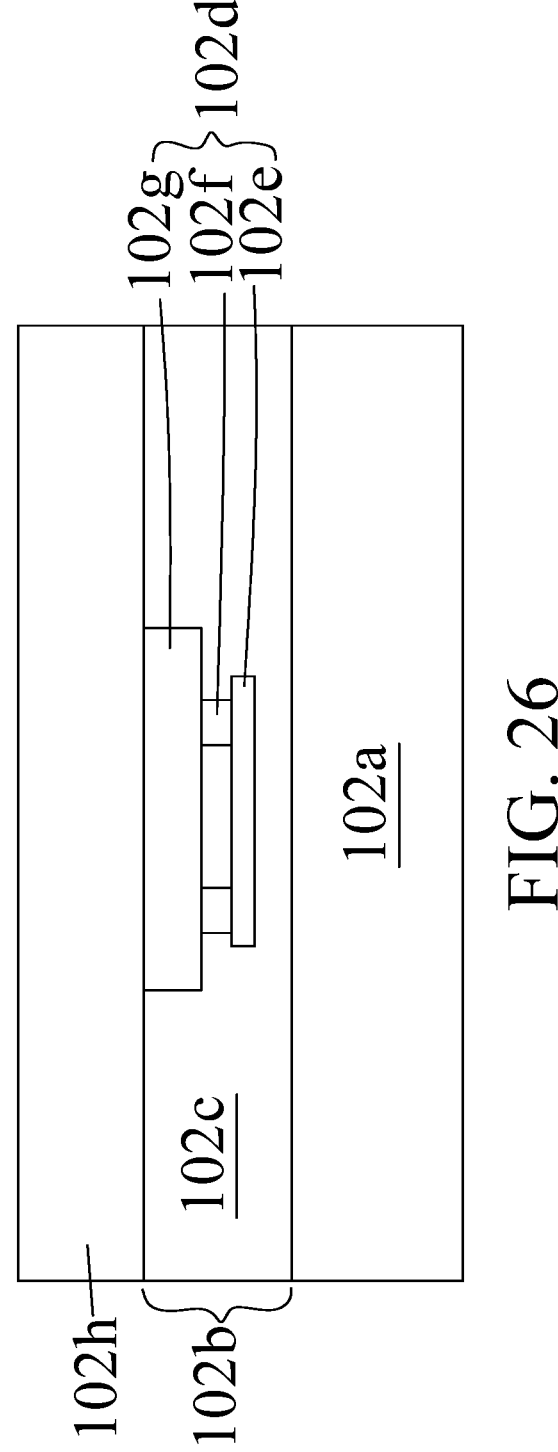

Referring to FIG. 26, the second bonding layer 102*h* is formed over the second dielectric layer 102*c*. In some embodiments, the second bonding layer 102*h* includes dielectric material such as oxide, nitride, silicon dioxide, silicon nitride, silicon oxynitride, silicon carbide, polymer or the like. In some embodiments, a top surface of the second conductive pad 102*g* is entirely covered by and in contact with the second bonding layer 102*h*. In some embodiments, the second bonding layer 102*h* is disposed by deposition, chemical vapor deposition (CVD) or another suitable process.

Figure 27:
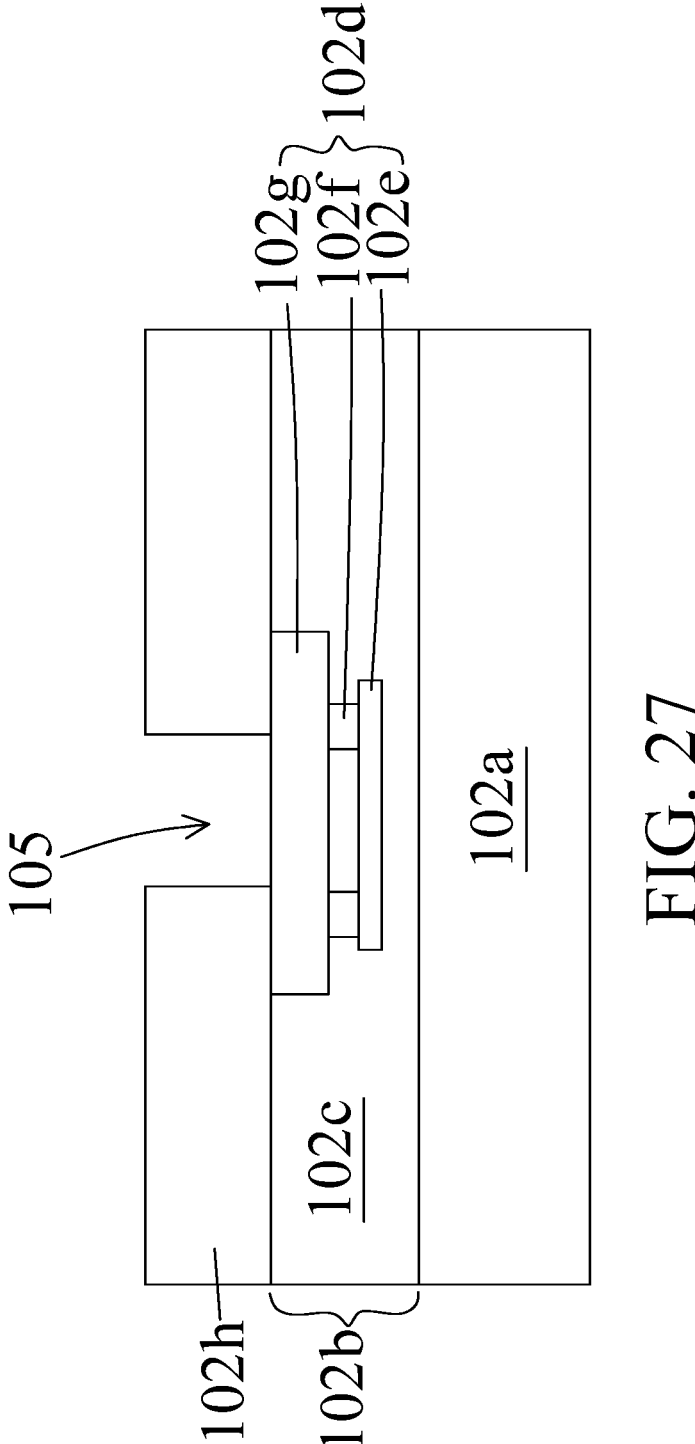
Figure 29:
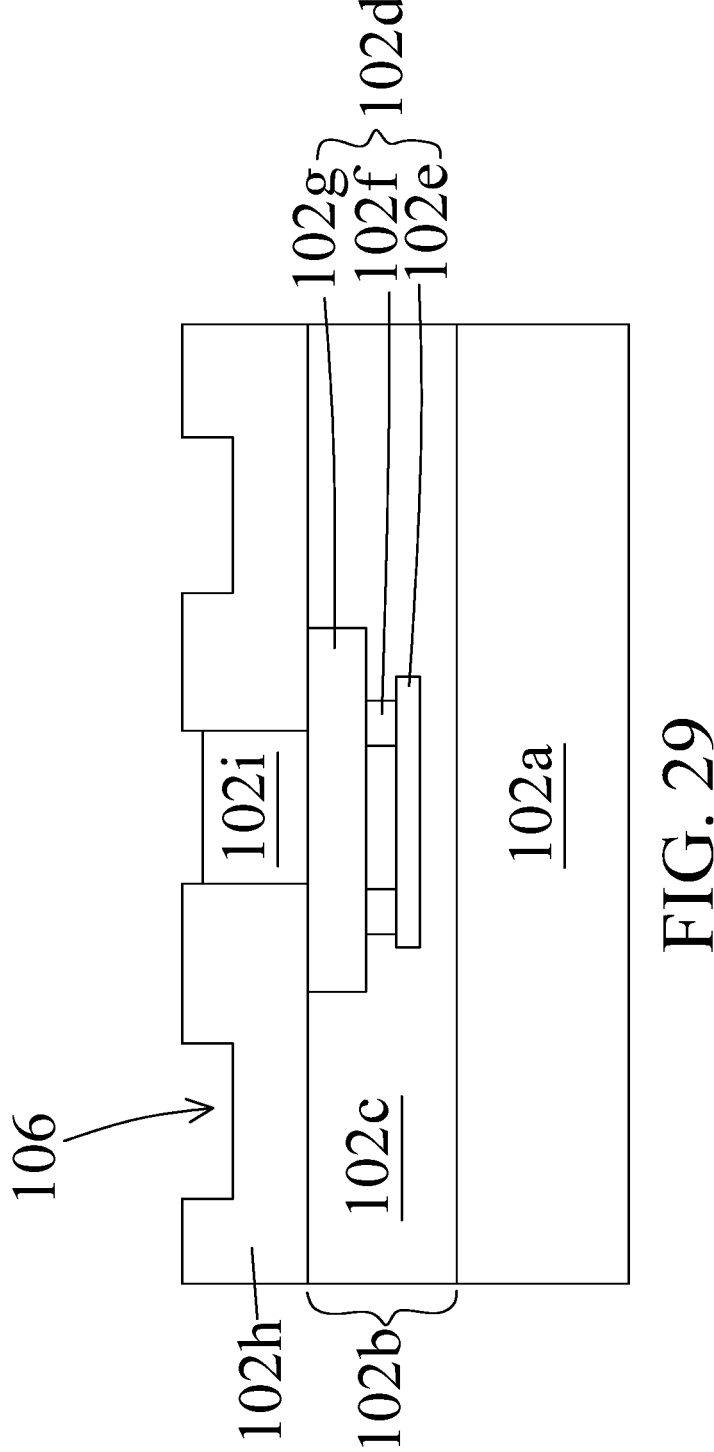

Referring to FIGS. 27 and 29, portions of the second bonding layer 102*h* are removed to form a third opening 105 extending through the second bonding layer 102*h* and a fourth opening 106 extending partially through the second bonding layer 102*h* according to step S307. In some embodiments as shown in FIG. 27, the third opening 105 extends through the second bonding layer 102*h* to expose at least a portion of the top surface of the second conductive pad 102*g*. In some embodiments as shown in FIG. 29, the fourth opening 106 extends partially through the second bonding layer 102*h*. In some embodiments, the portions of the second bonding layer 102*h* are removed by etching or any other suitable process. In some embodiments, the third opening 105 and the fourth opening 106 are formed simultaneously or sequentially.

Figure 28:
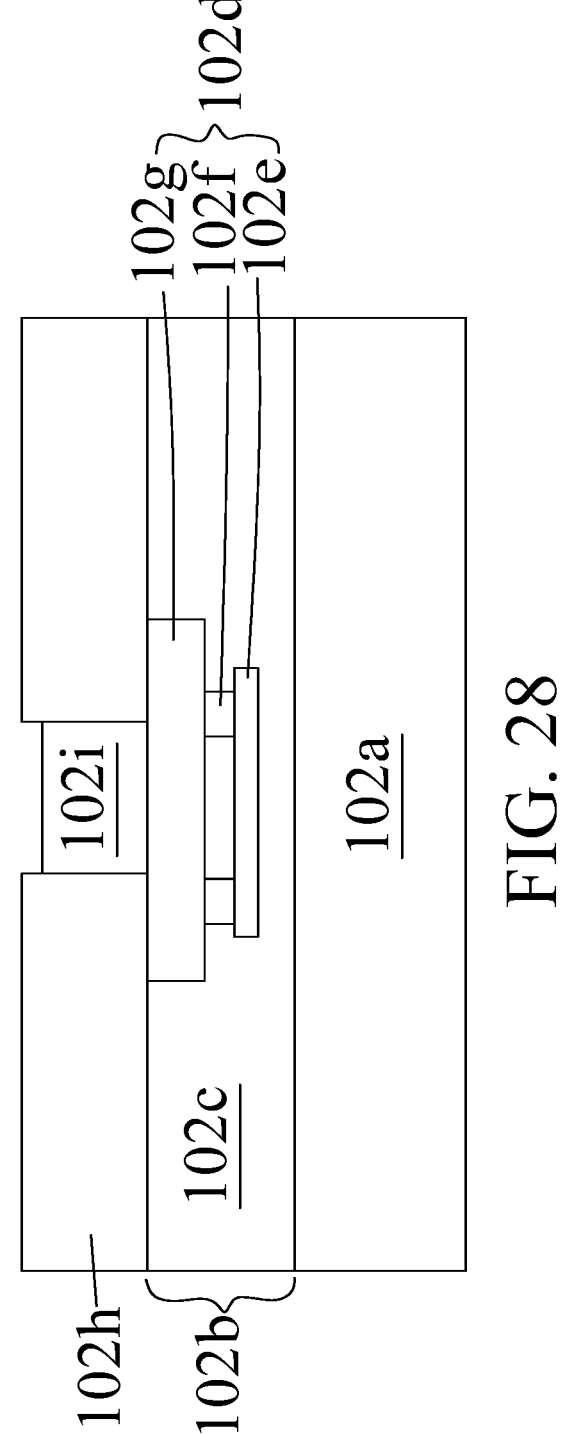
Figure 30:
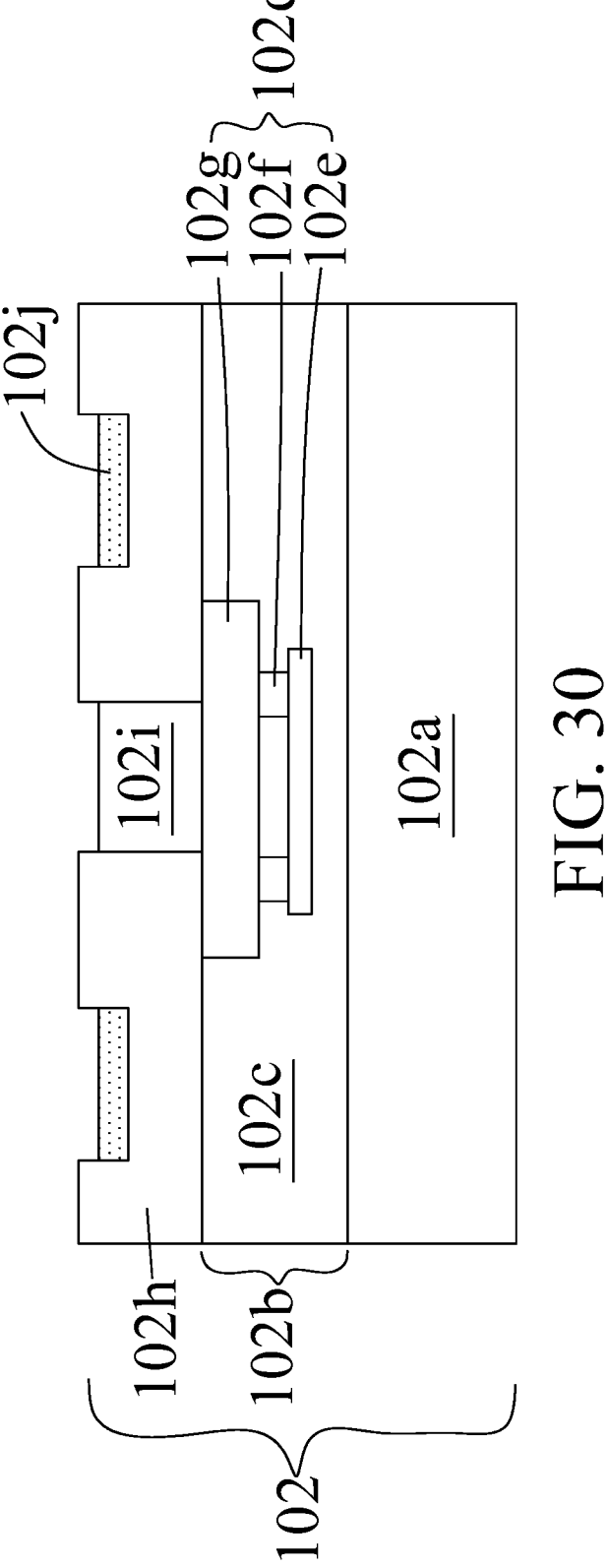

Referring to FIGS. 28 and 30, second conductive materials are disposed into the third opening 105 and the fourth opening 106 to form a second via 102*i* and a second dummy conductive member 102*j* respectively according to step S308 in FIG. 13. In some embodiments, the formation of the second via 102*i* and the formation of the second dummy conductive member 102*j* are implemented simultaneously or sequentially. In some embodiments, the second conductive materials include gold, silver, copper, nickel, tungsten, aluminum, tin, alloys thereof, or the like. In some embodiments, the second conductive materials are disposed by chemical vapor deposition (CVD), physical vapor deposition (PVD), sputtering or another suitable process. In some embodiments, the second wafer 102 is formed as shown in FIG. 30.

In some embodiments, the second via 102*i* partially fills the third opening 105, and the second dummy conductive member 102*j* partially fills the fourth opening 106, as shown in FIG. 30. In some embodiments, the second dummy conductive member 102*j* is formed in the second bonding layer 102*h* by the disposing of the second conductive materials prior to the bonding of the first dummy conductive member 101*j* to the second dummy conductive member 102*j*.

Figure 31:
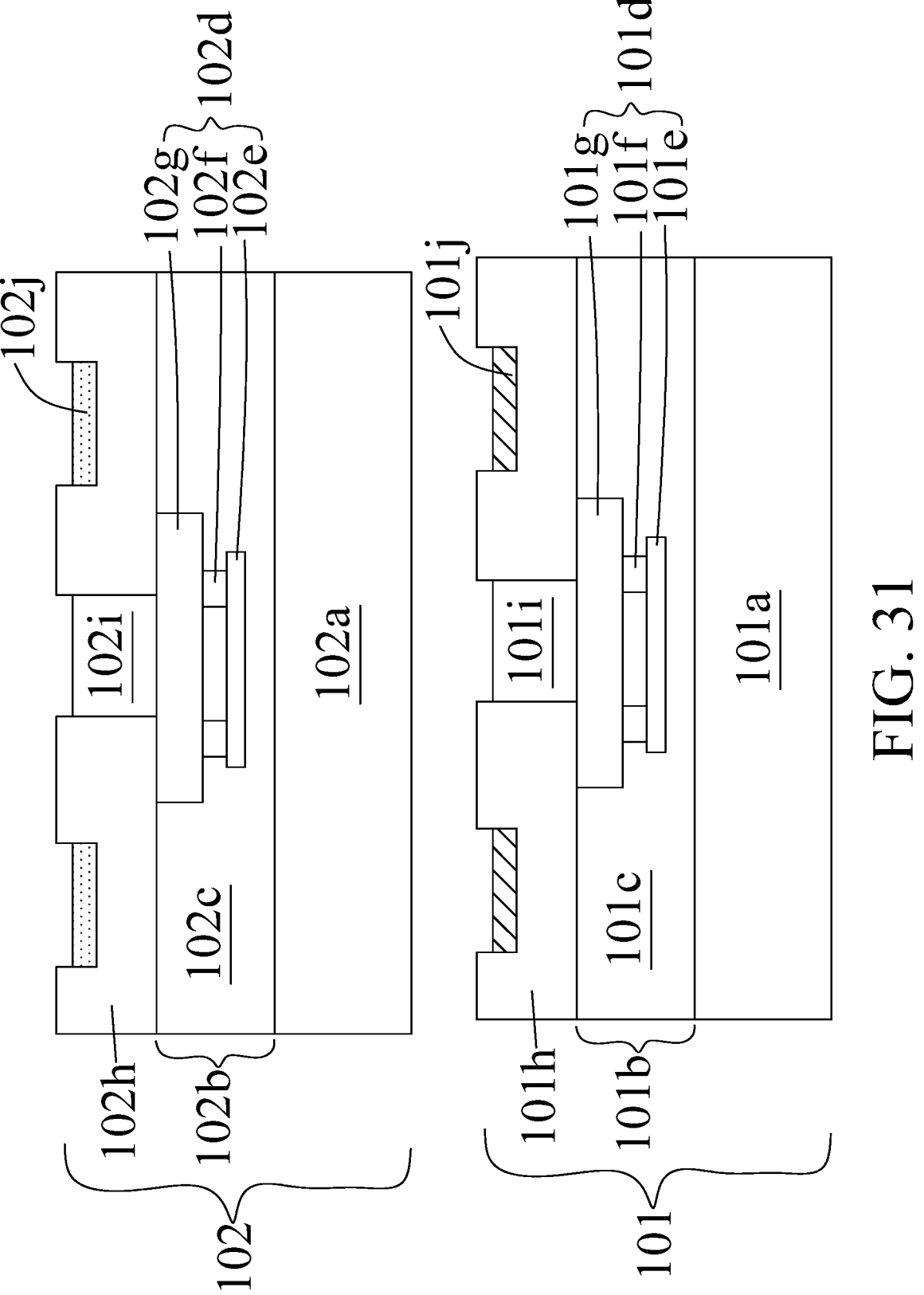
Figure 32:
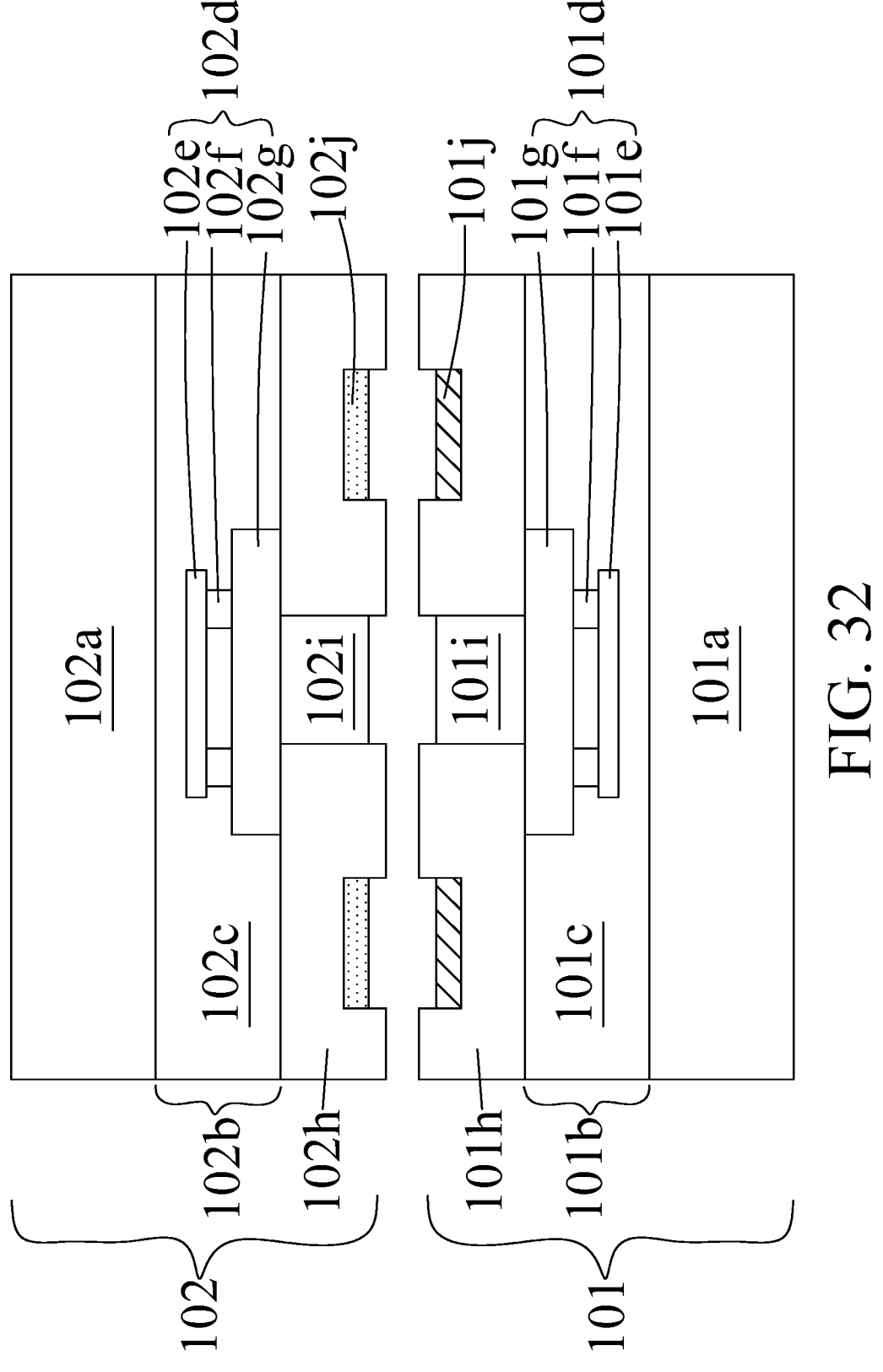

Referring to FIG. 31, the first wafer 101 and the second wafer 102 are respectively formed. In some embodiments, the formation of the first wafer 101 is performed prior to or after the formation of the second wafer 102. In some embodiments, the formation of the first wafer 101 and the formation of the second wafer 102 are performed simultaneously or separately. In some embodiments, the second wafer 102 is flipped after the formation of the second wafer 102 and prior to the bonding of the second wafer 102 over the first wafer 101, as shown in FIG. 32.

Figure 33:
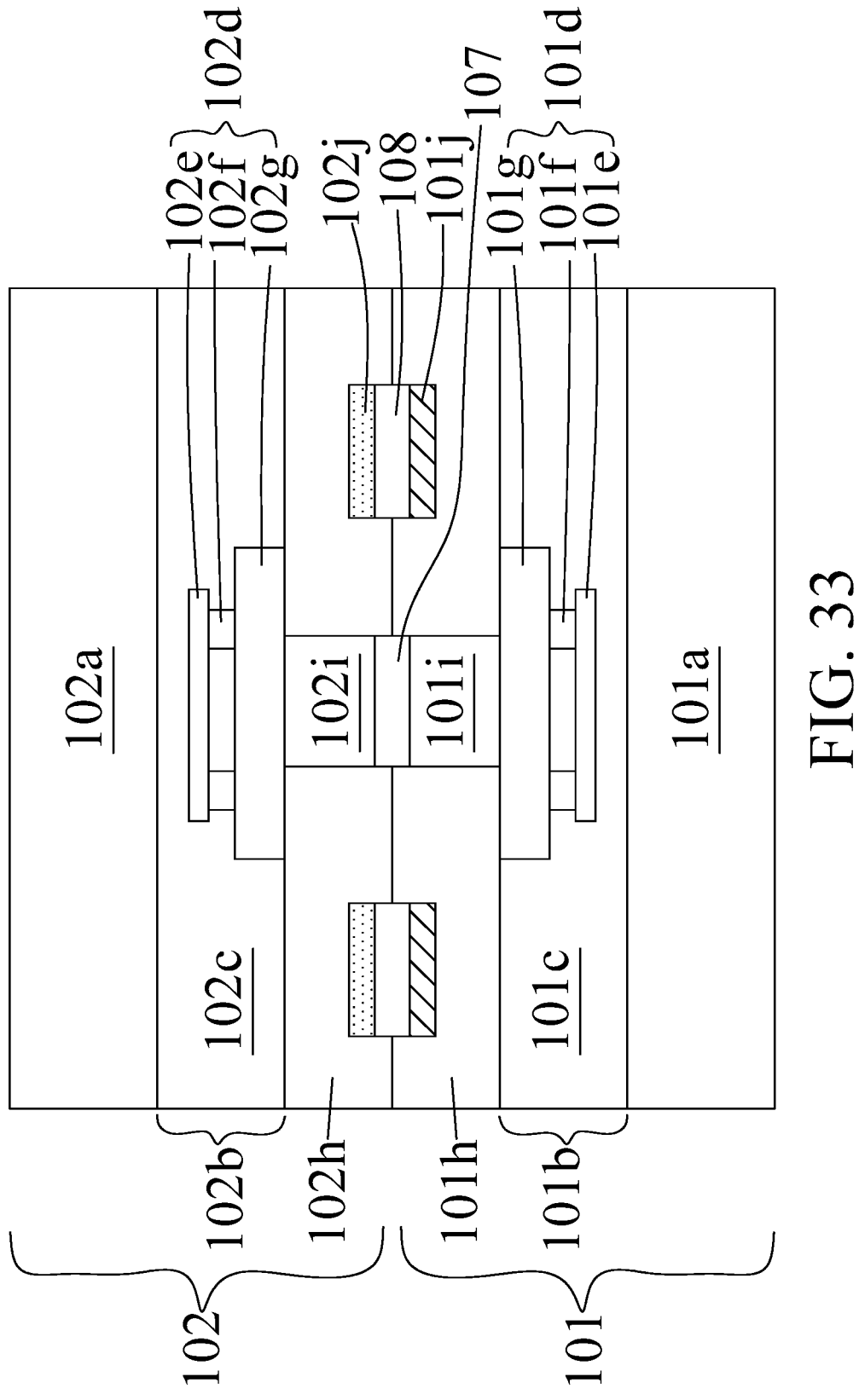
Figure 34:
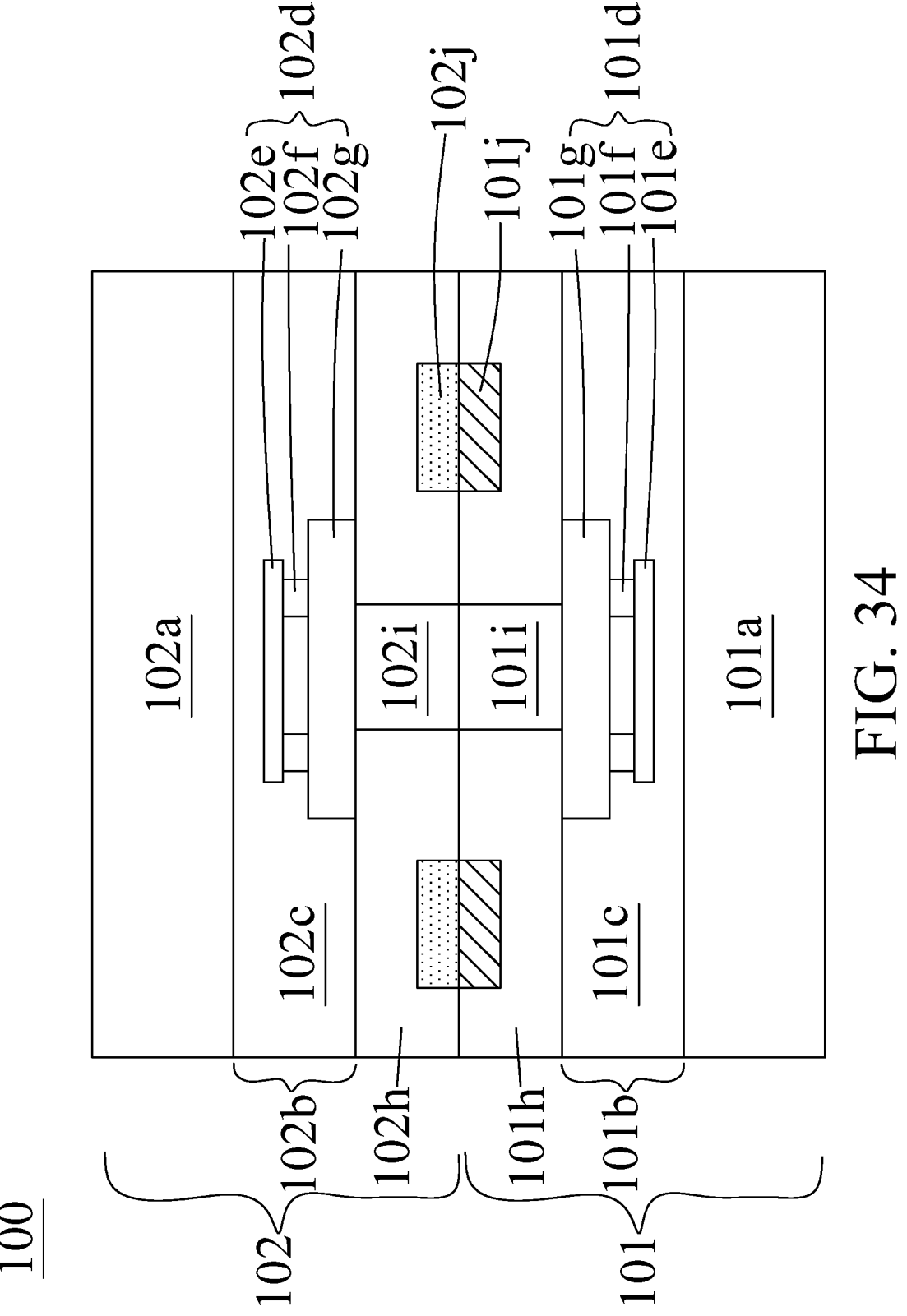

Referring to FIGS. 33 and 34, the second wafer 102 is bonded over the first wafer 101 according to step S309 in FIG. 13. In some embodiments, a hybrid bonding is formed between the first wafer 101 and the second wafer 102. In some embodiments, the hybrid bonding includes bonding the first via 101*i* to the second via 102*i*, bonding the first dummy conductive member 101*j* to the second dummy conductive member 102*j*, and bonding the first bonding layer 101*h* to the second bonding layer 102*h*.

Referring to FIG. 33, the first bonding layer 101*h* is bonded to the second bonding layer 102*h* according to step S310 in FIG. 13. In some embodiments, the bonding of the first bonding layer 101*h* to the second bonding layer 102*h* is performed at room temperature. In some embodiments, a first void 107 is formed between the first via 101*i* and the second via 102*i* after or during the bonding of the first bonding layer 101*h* to the second bonding layer 102*h* and before the bonding of the first via 101*i* to the second via 102*i*, and a second void 108 is formed between the first dummy conductive member 101*j* and the second dummy conductive member 102*j* by the bonding of the first bonding layer 101*h* to the second bonding layer 102*h* and before the bonding of the first dummy conductive member 101*j* to the second dummy conductive member 102*j*. In some embodiments, the first void 107 and the second void 108 are formed simultaneously. In some embodiments, the first void 107 and the second void 108 extend partially through the first bonding layer 101*h* and the second bonding layer 102*h*.

Referring to FIG. 34, the first via 101*i* is bonded to the second via 102*i* according to step S311 in FIG. 13, and the first dummy conductive member 101*j* is bonded to the second dummy conductive member 102*j* according to step S312 in FIG. 13. In some embodiments, the bonding of the first bonding layer 101*h* to the second bonding layer 102*h* is performed prior to the bonding of the first via 101*i* to the second via 102*i* and the bonding of the first dummy conductive member 101*j* to the second dummy conductive member 102*j*. In some embodiments, the bonding of the first via 101*i* to the second via 102*i* and the bonding of the first dummy conductive member 101*j* to the second dummy conductive member 102*j* are performed simultaneously. In some embodiments, a bonding force between the first via 101*i* and the second via 102*i* is substantially greater than a bonding force between the first bonding layer 101*h* and the second bonding layer 102*h*.

In some embodiments, the bonding of the first via 101$i$ to the second via 102$i$ and the bonding of the first dummy conductive member 101$j$ to the second dummy conductive member 102$j$ are performed at a temperature substantially above room temperature and less than or equal to 200° C. In some embodiments, the bonding of the first via 101$i$ to the second via 102$i$ and the bonding of the first dummy conductive member 101$j$ to the second dummy conductive member 102$j$ include heating the first wafer 101 and the second wafer 102 to a temperature substantially above room temperature and less than or equal to 200° C.

In some embodiments, the bonding of the first dummy conductive member 101$j$ to the second dummy conductive member 102$j$ includes expanding the first dummy conductive member 101$j$ and the second dummy conductive member 102$j$ toward each other. In some embodiments, the bonding of the first via 101$i$ to the second via 102$i$ includes expanding the first via 101$i$ and the second via 102$i$ toward each other. In some embodiments, a coefficient of thermal expansion (CTE) of the first dummy conductive member 101$j$ is substantially greater than a CTE of the first bonding layer 101$h$, and a CTE of the second dummy conductive member 102$j$ is substantially greater than a CTE of the second bonding layer 102$h$. In some embodiments, a CTE of the first via 101$i$ is substantially greater than the CTE of the first bonding layer 101$h$, and a CTE of the second via 102$i$ is substantially greater than the CTE of the second bonding layer 102$h$.

Figure 35:
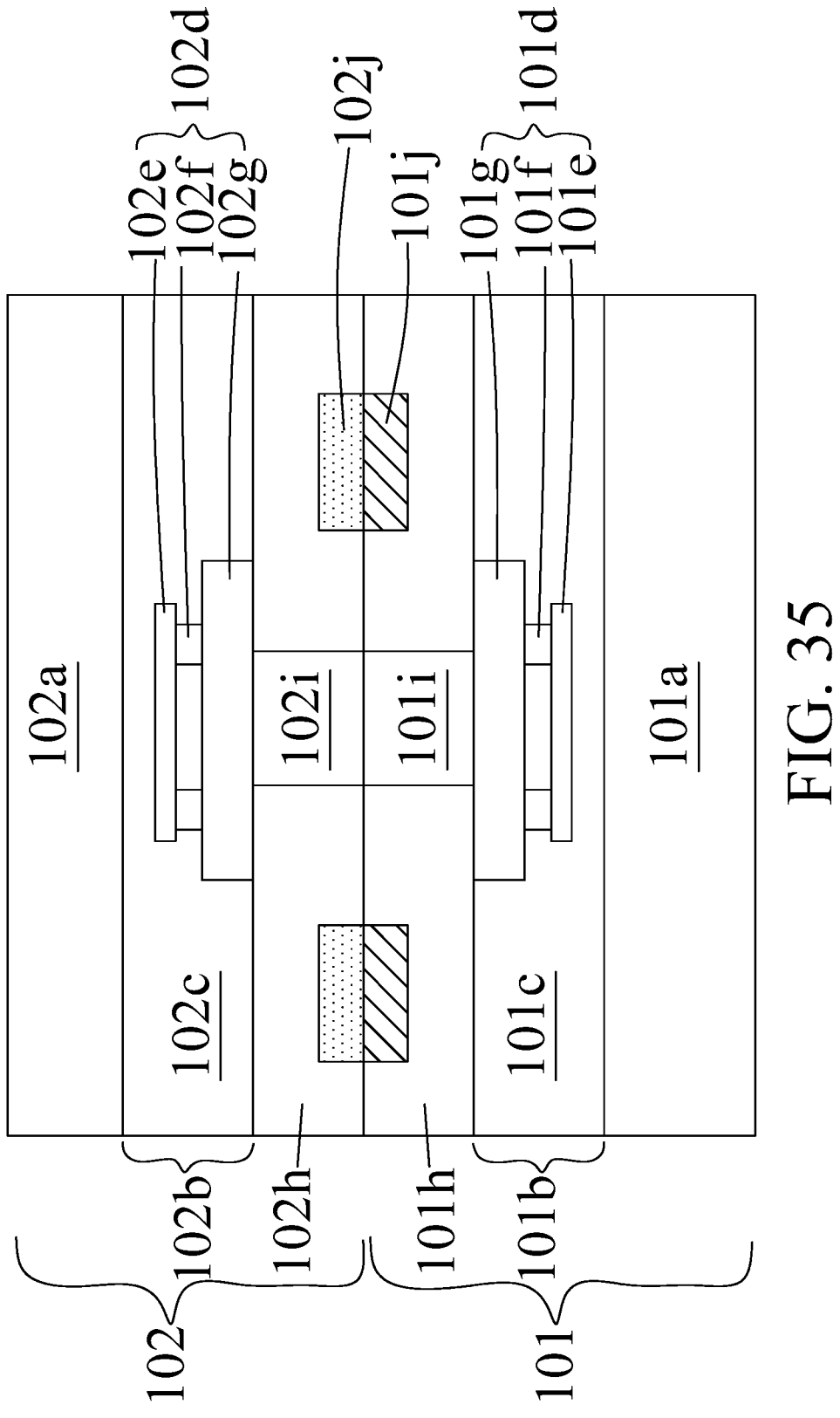

In some embodiments, the first semiconductor structure 100 shown in FIG. 1 is formed as shown in FIG. 34. In some embodiments, a thickness of the second substrate 102$a$ is reduced as shown in FIG. 35. In some embodiments, the thickness of the second substrate 102$a$ is reduced by grinding or any other suitable process. Since the first and second dummy conductive members 101$j$ and 102$j$ are in a predetermined density, a bonding strength between the first and second wafers 101 and 102 is increased or improved, and delamination or peeling off of the second wafer 102 from the first wafer 101 is prevented.

Figure 36:
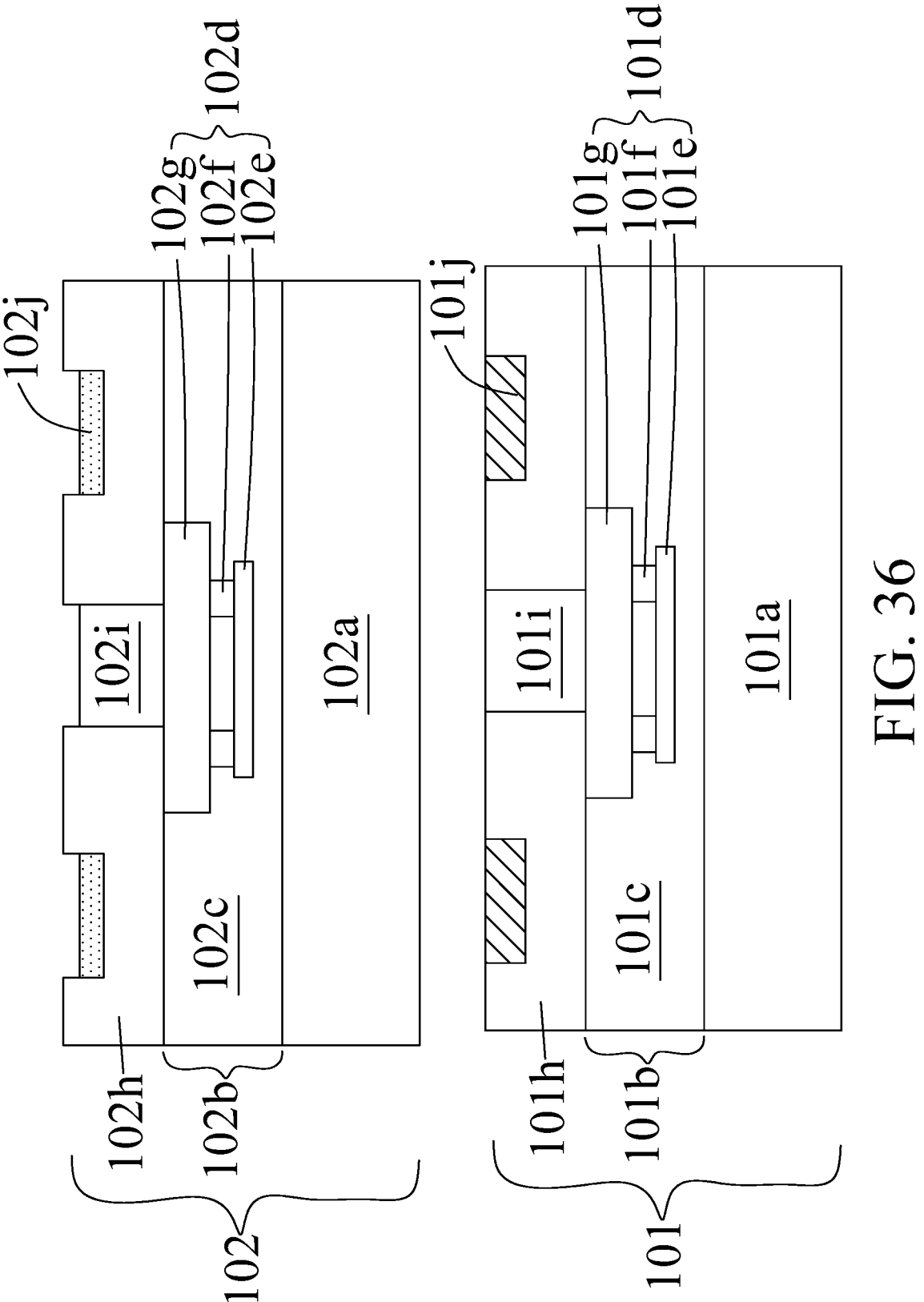
Figure 37:
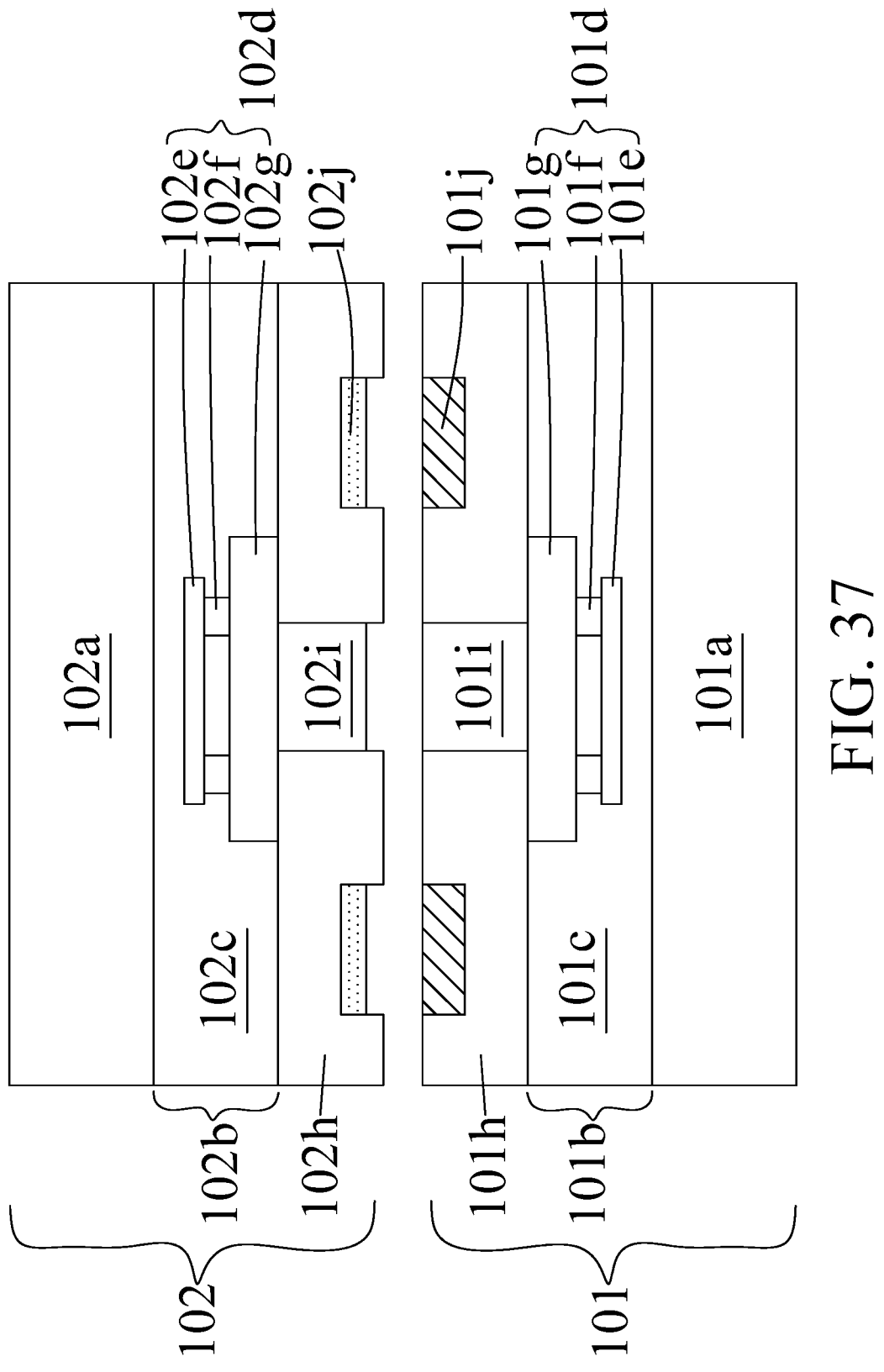
Figure 38:
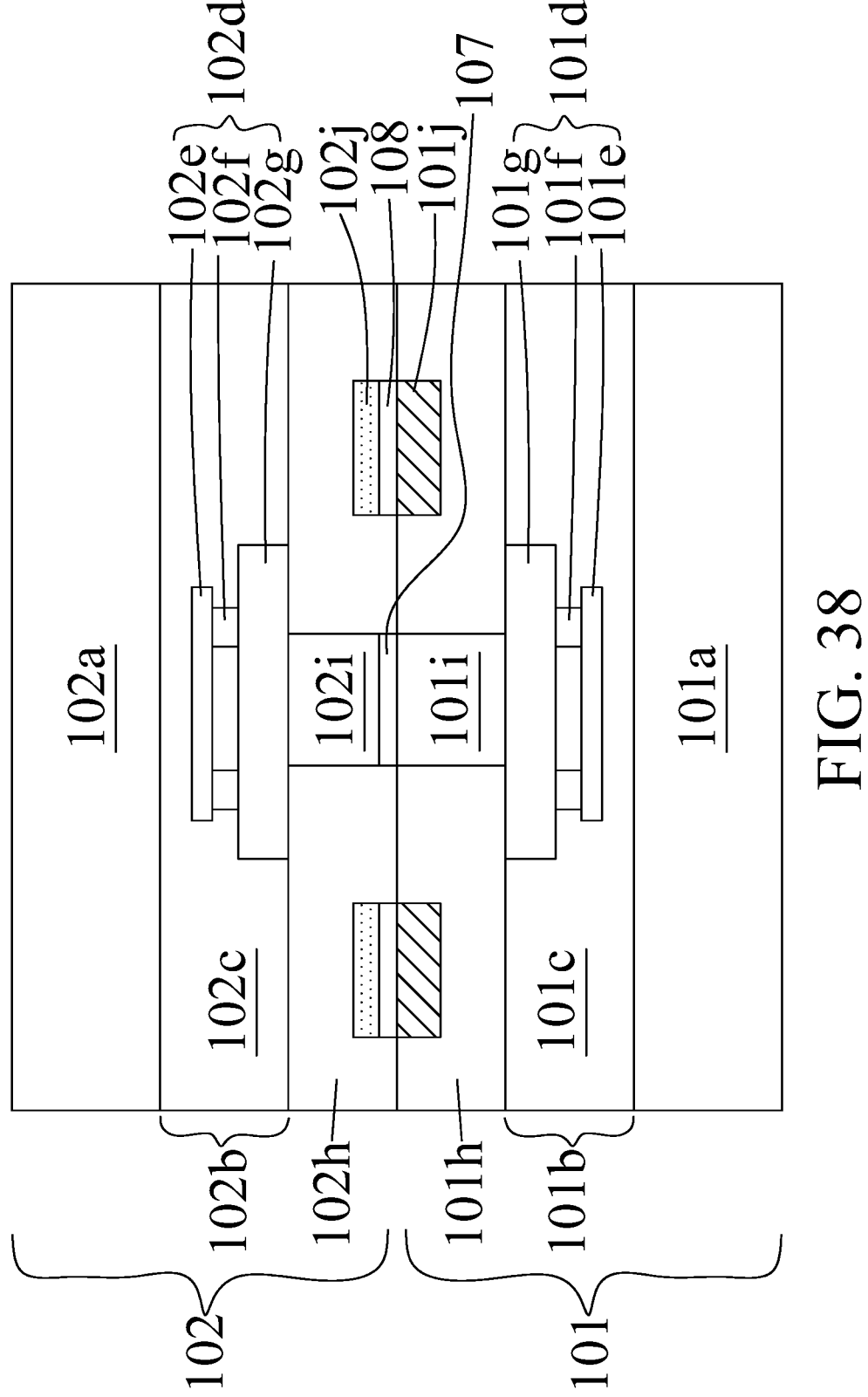
Figure 39:
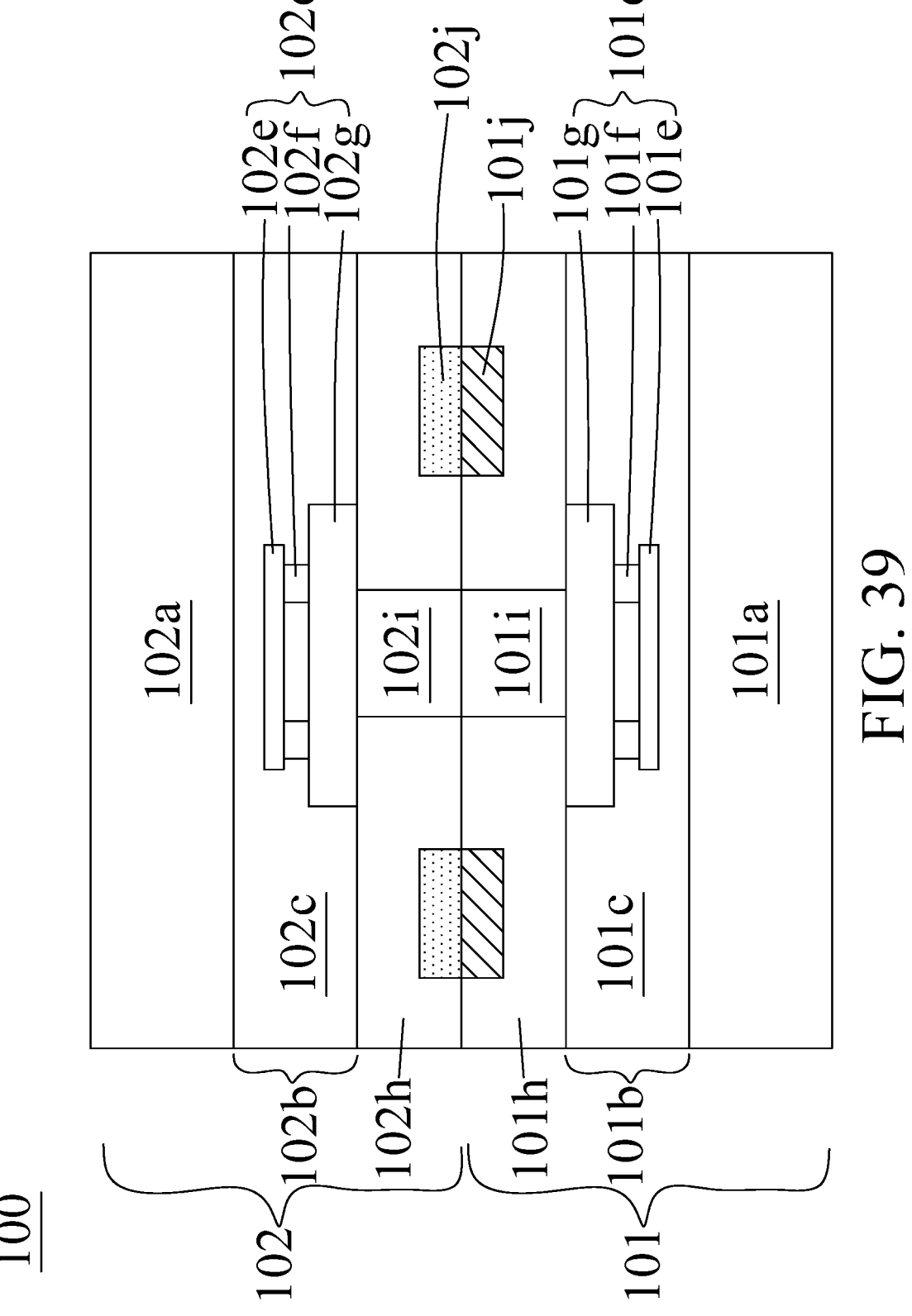

In an alternative embodiment, the first wafer 101 as shown in FIG. 22 is formed as shown in FIG. 36. The second wafer 102 is flipped and disposed over the first wafer 101 as shown in FIG. 37. In some embodiments, the first bonding layer 101$h$ is bonded to the second bonding layer 102$h$, similar to the step S310 as discussed above. In some embodiments, the first void 107 and the second void 108 are formed as shown in FIG. 38, and are similar to those shown in FIG. 33. In some embodiments, the first via 101$i$ is bonded to the second via 101$j$, and the first dummy conductive member 101$j$ is bonded to the second dummy conductive member 102$j$. In some embodiments, the first semiconductor structure 100 shown in FIG. 1 is formed as shown in FIG. 39.

In conclusion, a semiconductor structure includes two wafers bonded to each other by bonding layers and dummy conductive members surrounded by the bonding layers. Because the dummy conductive members are in a predetermined density, a bonding strength between the two wafers is increased or improved. Since the bonding strength is increased or improved by including the dummy conductive members in the predetermined density, delamination of the two wafers caused by subsequent processes such as grinding of the wafer can be minimized or prevented. Therefore, an overall structure and reliability of the semiconductor structure is improved.

One aspect of the present disclosure provides a semiconductor structure. The semiconductor structure includes a first wafer including a first substrate, a first dielectric layer over the first substrate, a first bonding layer over the first dielectric layer, a first via extending through the first bonding layer, and a first dummy conductive member disposed adjacent to the first via and extending partially through the first bonding layer; and a second wafer including a second bonding layer over the first bonding layer, a second via extending through the second bonding layer, a second dummy conductive member disposed adjacent to the second via and extending partially through the second bonding layer, a second dielectric layer over the second bonding layer, and a second substrate over the second dielectric layer, wherein the second bonding layer, the second via and the second dummy conductive member are respectively bonded to the first bonding layer, the first via and the first dummy conductive member.

Another aspect of the present disclosure provides a semiconductor structure. The semiconductor structure includes a first wafer including a first substrate, a first bonding layer over the first substrate, a first via extending through the first bonding layer, and a plurality of first dummy conductive members disposed adjacent to the first via and extending partially through the first bonding layer; and a second wafer including a second bonding layer over the first bonding layer, a second via extending through the second bonding layer, and a plurality of second dummy conductive members disposed adjacent to the second via and extending partially through the second bonding layer, wherein the first bonding layer is bonded to the second bonding layer, and the plurality of first dummy conductive members are correspondingly bonded to the plurality of second dummy conductive members.

Another aspect of the present disclosure provides a method of manufacturing a semiconductor structure. The method includes steps of forming a first wafer, including: providing a first substrate, a first dielectric layer over the first substrate, and a first bonding layer over the first dielectric layer; removing portions of the first bonding layer to form a first opening extending through the first bonding layer and a second opening extending partially through the first bonding layer; and disposing first conductive materials into the first opening and the second opening to form a first via and a first dummy conductive member, respectively; forming a second wafer, including: providing a second substrate, a second dielectric layer over the second substrate, and a second bonding layer over the second dielectric layer; removing portions of the second bonding layer to form a third opening extending through the second bonding layer and a fourth opening extending partially through the second bonding layer; and disposing second conductive materials into the third opening and the fourth opening to form a second via and a second dummy conductive member, respectively; bonding the second wafer to the first wafer, including: bonding the first bonding layer to the second bonding layer; bonding the first via to the second via; and bonding the first dummy conductive member to the second dummy conductive member.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of manufacturing a semiconductor structure, comprising:

forming a first wafer, including:

providing a first substrate, a first dielectric layer over the first substrate, and a first bonding layer over the first dielectric layer;

removing portions of the first bonding layer to form a first opening extending through the first bonding layer and a second opening extending partially through the first bonding layer; and disposing first conductive materials into the first opening and the second opening to form a first via and a first dummy conductive member respectively;

forming a second wafer, including:

providing a second substrate, a second dielectric layer over the second substrate, and a second bonding layer over the second dielectric layer;

removing portions of the second bonding layer to form a third opening extending through the second bonding layer and a fourth opening extending partially through the second bonding layer; and disposing second conductive materials into the third opening and the fourth opening to form a second via and a second dummy conductive member respectively; and bonding the second wafer to the first wafer, including:

bonding the first bonding layer to the second bonding layer;

bonding the first via to the second via; and bonding the first dummy conductive member to the second dummy conductive member;

wherein the bonding of the first via to the second via and the bonding of the first dummy conductive member to the second dummy conductive member are performed simultaneously.

2. The method of claim 1, wherein the bonding of the first bonding layer to the second bonding layer is performed prior to the bonding of the first via to the second via and the bonding of the first dummy conductive member to the second dummy conductive member.

3. The method of claim 1, wherein the bonding of the first bonding layer to the second bonding layer is performed at room temperature.

4. The method of claim 1, wherein the bonding of the first via to the second via and the bonding of the first dummy conductive member to the second dummy conductive member are performed at a temperature substantially above room temperature and less than or equal to 200° C.

5. The method of claim 1, wherein the bonding of the first via to the second via and the bonding of the first dummy conductive member to the second dummy conductive member include heating the first wafer and the second wafer to a temperature substantially above room temperature and less than or equal to 200° C.

6. The method of claim 1, wherein the bonding of the first dummy conductive member to the second dummy conductive member includes expanding the first dummy conductive member and the second dummy conductive member toward each other.

7. The method of claim 1, wherein the bonding of the first via to the second via includes expanding the first via and the second via toward each other.

8. The method of claim 1, wherein a coefficient of thermal expansion (CTE) of the first dummy conductive member is substantially greater than a CTE of the first bonding layer, and a CTE of the second dummy conductive member is substantially greater than a CTE of the second bonding layer.

9. The method of claim 1, wherein the first dummy conductive member is formed in the first bonding layer by the disposing of the first conductive materials prior to the bonding of the first dummy conductive member to the second dummy conductive member.

10. The method of claim 1, wherein the second dummy conductive member is formed in the second bonding layer by the disposing of the second conductive materials prior to the bonding of the first dummy conductive member to the second dummy conductive member.

11. The method of claim 1, wherein a first void is formed between the first via and the second via after or during the bonding of the first bonding layer to the second bonding layer and before the bonding of the first via to the second via, and a second void is formed between the first dummy conductive member and the second dummy conductive member after or during the bonding of the first bonding layer to the second bonding layer and before the bonding of the first dummy conductive member to the second dummy conductive member.

12. The method of claim 11, wherein the first void and the second void are formed simultaneously.

13. The method of claim 11, wherein the first void and the second void extend partially through the first bonding layer and the second bonding layer.

14. The method of claim 1, wherein the bonding of the first bonding layer to the second bonding layer and the bonding of the first dummy conductive member to the second dummy conductive member are performed by a hybrid bonding.

* * * * *